US012677598B2

(12) United States Patent
Yamada et al.

(10) Patent No.: US 12,677,598 B2
(45) Date of Patent: Jul. 7, 2026

(54) MAGNETIC ARRAY, MAGNETIC ARRAY CONTROL METHOD, AND MAGNETIC ARRAY CONTROL PROGRAM

(71) Applicant: TDK CORPORATION, Tokyo (JP)

(72) Inventors: Shogo Yamada, Tokyo (JP); Tatsuo Shibata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 193 days.

(21) Appl. No.: 18/270,114

(22) PCT Filed: Jan. 12, 2021

(86) PCT No.: PCT/JP2021/000698
§ 371 (c)(1),
(2) Date: Jun. 28, 2023

(87) PCT Pub. No.: WO2022/153366
PCT Pub. Date: Jul. 21, 2022

(65) Prior Publication Data
US 2024/0074323 A1 Feb. 29, 2024

(51) Int. Cl.
*H10N 50/10* (2023.01)
*G11C 11/16* (2006.01)
(Continued)

(52) U.S. Cl.
CPC .......... *H10N 50/10* (2023.02); *G11C 11/161* (2013.01); *G11C 11/1673* (2013.01);
(Continued)

(58) Field of Classification Search
CPC ... H10N 50/10; G11C 11/161; G11C 11/1673; G11C 11/1675; G11C 19/0808;
(Continued)

(56) References Cited

U.S. PATENT DOCUMENTS 9,171,617 B1 * 10/2015 Park ................... G11C 13/0064
2005/0128807 A1 * 6/2005 Chen .................. G11C 16/3418
365/185.17
(Continued)

FOREIGN PATENT DOCUMENTS

JP 5441005 B2 3/2014
JP 2017004587 A * 1/2017 ......... G11C 13/0061
(Continued)

OTHER PUBLICATIONS

Translation of JP2017004587A Specification (Year: 2017).*
(Continued)

*Primary Examiner* — Sultana Begum
*Assistant Examiner* — Elizabeth Rose Agger
(74) *Attorney, Agent, or Firm* — Oliff PLC

(57) ABSTRACT

A magnetic array includes: a plurality of magnetoresistance effect elements; and a pulse application device which applies a pulse to each of the plurality of magnetoresistance effect elements, wherein each of the plurality of magnetoresistance effect elements includes domain wall motion layer, ferromagnetic layer, and non-magnetic layer sandwiched between the domain wall motion layer and the ferromagnetic layer, wherein the pulse application device is configured to apply an initialization pulse and an operation pulse to each of the plurality of magnetoresistance effect elements, wherein the initialization pulse has a first pulse that is applied a plurality of times to spread a distribution of resistance values of the plurality of magnetoresistance effect elements from an initial distribution, and wherein a voltage of each first pulse is smaller than that of the operation pulse or each pulse length of the first pulse is shorter than that of the operation pulse.

37 Claims, 18 Drawing Sheets

(51) Int. Cl.
  *G11C 19/08*    (2006.01)
  *H10B 61/00*    (2023.01)
  *G11C 11/54*    (2006.01)
(52) U.S. Cl.
  CPC ...... *G11C 11/1675* (2013.01); *G11C 19/0808*
    (2013.01); *H10B 61/00* (2023.02); *H10B*
    *61/22* (2023.02)
(58) Field of Classification Search
  CPC ..... G11C 11/54; G11C 11/1659; H10B 61/00;
    H10B 61/22
  See application file for complete search history.

(56)           References Cited

U.S. PATENT DOCUMENTS

| | | | | |
|---|---|---|---|---|
| 2007/0291527 | A1* | 12/2007 | Tsushima | G11C 13/0069 |
| | | | | 365/148 |
| 2008/0111245 | A1* | 5/2008 | Osano | H10B 63/00 |
| | | | | 257/767 |
| 2011/0129691 | A1 | 6/2011 | Ishiwata et al. | |
| 2011/0188297 | A1 | 8/2011 | Ogimoto et al. | |
| 2017/0249982 | A1 | 8/2017 | Conraux | |
| 2018/0358105 | A1* | 12/2018 | Sasaki | G11C 11/1673 |
| 2019/0035449 | A1* | 1/2019 | Saida | G06N 3/084 |
| 2020/0105310 | A1 | 4/2020 | Ashida et al. | |
| 2020/0194664 | A1* | 6/2020 | Shinohara | G11C 11/1675 |
| 2021/0036217 | A1 | 2/2021 | Nozaki et al. | |
| 2024/0074323 | A1 | 2/2024 | Yamada et al. | |

FOREIGN PATENT DOCUMENTS

| | | |
|---|---|---|
| JP | 6617829 B2 | 12/2019 |
| JP | 2020-053660 A | 4/2020 |

OTHER PUBLICATIONS

Apr. 6, 2021 International Search Report issued in International Application No. PCT/JP2021/000698.
May 10, 2022 Search Report issued in International Patent Application No. PCT/JP2022/010284.
Feb. 20, 2026 Office Action issued in U.S. Appl. No. 18/844,170.
U.S. Appl. No. 18/844,170 filed on Sep. 5, 2024 in the name of Shogo Yamada.

* cited by examiner

MAGNETIC ARRAY, MAGNETIC ARRAY CONTROL METHOD, AND MAGNETIC ARRAY CONTROL PROGRAM

TECHNICAL FIELD

The present disclosure relates to a magnetic array, a magnetic array control method, and a magnetic array control program.

BACKGROUND ART

A magnetoresistance effect element which uses a resistance value change (magnetoresistance change) based on a change in the relative angle of magnetizations of two ferromagnetic layers is known. For example, a domain wall motion magnetoresistance effect element (hereinafter, referred to as a domain wall motion element) described in Patent Document 1 is an example of the magnetoresistance effect element. The domain wall motion element changes the resistance value in the laminating direction depending on the position of the domain wall, and can store data in multi-value or analog.

The domain wall motion element can be used in a neuromorphic device that imitates the functions of the brain, as described in Patent Document 2, for example.

CITATION LIST

Patent Document

[Patent Document 1]
    Japanese Patent No. 5441005
[Patent Document 2]
    Japanese Patent No. 6617829

SUMMARY OF INVENTION

Technical Problem

The domain wall motion element is often used by integrating a plurality of elements. When using the domain wall motion element, each of the plurality of domain wall motion elements is initialized. For example, in the case of the neuromorphic device, learning accuracy and learning efficiency are improved when there are variations in the initial states of the plurality of domain wall motion elements before learning. However, it takes time to control each initial state separately and it becomes more difficult to create variations in the initial states of the plurality of domain wall motion elements as the number of domain wall motion elements increases.

The present disclosure has been made in view of the above-described circumstances and an object thereof is to provide a magnetic array, a magnetic array control method, and a magnetic array control program capable of easily giving variations to the initial states of a plurality of domain wall motion elements.

Solution to Problem

A magnetic array according to a first aspect includes: a plurality of magnetoresistance effect elements; and a pulse application device which applies a pulse to each of the plurality of magnetoresistance effect elements. Each of the plurality of magnetoresistance effect elements includes a domain wall motion layer, a ferromagnetic layer, and a non-magnetic layer sandwiched between the domain wall motion layer and the ferromagnetic layer. The pulse application device is configured to apply an initialization pulse and an operation pulse to each of the plurality of magnetoresistance effect elements. The initialization pulse has a first pulse. The first pulse is applied a plurality of times to spread a distribution of resistance values of the plurality of magnetoresistance effect elements from an initial distribution. A voltage of each first pulse is smaller than a voltage of the operation pulse or each pulse length of the first pulse is shorter than a pulse length of the operation pulse.

A magnetic array according to a second aspect includes: a plurality of magnetoresistance effect elements; and a pulse application device which applies a pulse to each of the plurality of magnetoresistance effect elements. Each of the plurality of magnetoresistance effect elements includes a domain wall motion layer, a ferromagnetic layer, and a non-magnetic layer sandwiched between the domain wall motion layer and the ferromagnetic layer. The pulse application device is configured to apply an initialization pulse to each of the plurality of magnetoresistance effect elements. The initialization pulse has a first pulse. The first pulse is applied a plurality of times to spread a distribution of resistance values of the plurality of magnetoresistance effect elements from an initial distribution. The first pulse is applied to each of the plurality of magnetoresistance effect elements under a condition that the probability that a resistance value of each magnetoresistance effect element changes when the first pulse is applied to each magnetoresistance effect element is larger than 0% and smaller than 100%.

A magnetic array control method according to a third aspect includes an initialization step. The initialization step initializes a plurality of magnetoresistance effect elements each including a domain wall motion layer, a ferromagnetic layer, and a non-magnetic layer sandwiched between the domain wall motion layer and the ferromagnetic layer. The initialization step includes a first step and a second step. The first step sets an initial distribution of the resistance values of the plurality of magnetoresistance effect elements. The second step applies a first pulse to each of the plurality of magnetoresistance effect elements a plurality of times to spread the initial distribution.

A magnetic array control program according to a fourth aspect includes an initialization program. The initialization program instructs to initialize a plurality of magnetoresistance effect elements. Each of the plurality of magnetoresistance effect elements includes a domain wall motion layer, a ferromagnetic layer, and a non-magnetic layer sandwiched between the domain wall motion layer and the ferromagnetic layer. The initialization program includes a first program and a second program. The first program sets an initial distribution of the resistance values of the plurality of magnetoresistance effect elements. The second program instructs to apply a first pulse to each of the plurality of magnetoresistance effect elements a plurality of times to spread the initial distribution.

Advantageous Effects of Invention

The domain wall motion element and the magnetic array according to the above-described aspects can easily give variations to the initial states of the plurality of domain wall motion elements.

DESCRIPTION OF EMBODIMENTS

Figure 1:
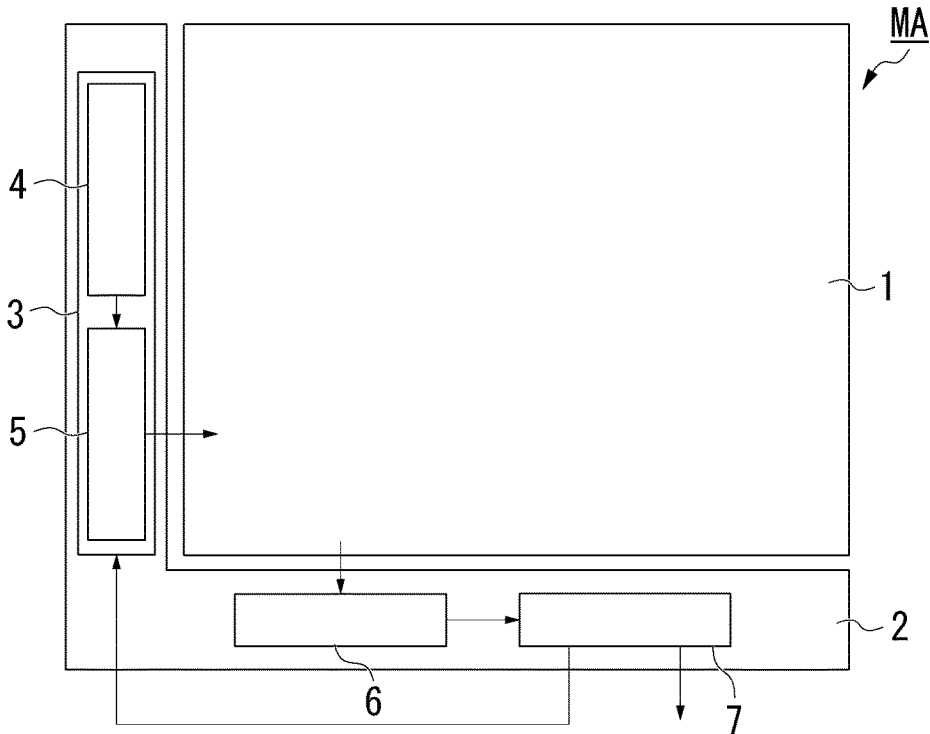
FIG. 1 is a block diagram of a magnetic array according to a first embodiment.

Hereinafter, this embodiment will be described in detail by appropriately referring to the drawings. In the drawings used in the following description, there are cases in which the featured parts are enlarged for convenience in order to easily understand the features of the present disclosure and the dimensional ratios of each component may differ from the actual ones. The materials, dimensions, and the like exemplified in the following description are examples, and the present disclosure is not limited to them and can be implemented with appropriate modifications within the scope of the present disclosure.

First, directions will be defined. The x direction and the y direction are directions substantially parallel to one surface of a substrate Sub (see FIG. 4) to be described later. The x direction is a direction in which a domain wall motion layer 10 to be described later extends. The y direction is a direction orthogonal to the x direction. The z direction is a direction from the substrate Sub to be described later toward a domain wall motion element 100. In this specification, the +z direction may be expressed as "up" and the −z direction may be expressed as "down", but these expressions are for convenience and do not define the direction of gravity. In this specification, "extending in the x direction" means, for example, that the dimension in the x direction is larger than the minimum dimension of the dimensions in the x direction, the y direction, and the z direction. The same applies to the case of extending in other directions. In the present specification, "connected" is not limited to direct connection, but also includes connection via another object.

First Embodiment

FIG. 1 is a block diagram of a magnetic array MA according to a first embodiment. The magnetic array MA includes an integrated area 1 and a peripheral area 2. The magnetic array MA can be used, for example, in magnetic memories, sum-of-products calculators, neuromorphic devices, spin memristors, and magneto-optical elements.

The integrated area 1 is an area in which a plurality of domain wall motion elements are integrated. The domain wall motion element is an example of a magnetoresistance effect element. When the magnetic array MA is used as a memory, data is accumulated in the integrated area 1. When the magnetic array MA is used as a neuromorphic device, the integrated area 1 is used for learning.

The peripheral area 2 is an area in which control elements for controlling the operation of the domain wall motion elements in the integrated area 1 are mounted. The peripheral area 2 includes, for example, a pulse application device 3, a resistance detection device 6, and a control device 7.

The pulse application device 3 is configured to apply a pulse to each of the plurality of domain wall motion elements in the integrated area 1. The pulse application device 3 includes, for example, a control unit 4 and an output unit 5. The control unit 4 has, for example, a control program that controls signal input to the magnetic array MA and signal output from the magnetic array MA. Details of the control program will be described later. The control unit 4 controls, for example, an address of the domain wall motion element to which a pulse is applied, a magnitude (voltage and pulse length) of a pulse to be applied to a predetermined domain wall motion element, and the like. The output unit 5 applies a predetermined pulse to a predetermined domain wall motion element according to the instruction from the control unit 4. The output unit 5 includes, for example, a power supply.

The resistance detection device 6 is configured to detect a resistance value of the domain wall motion element in the integrated area 1. The resistance detection device 6 may detect the resistance of each domain wall motion element in the integrated area 1 or may detect, for example, the total resistance of the domain wall motion elements belonging to the same column. The resistance detection device 6 has, for example, a comparator that compares the magnitudes of the detected resistance values. The comparator may, for example, compare the detected resistance values or may compare a preset reference resistance value and the detected resistance value. The control device 7 is connected to the resistance detection device 6. The control device 7 outputs a result from the resistance detection device 6. Further, the control device 7 may also feed back the result from the resistance detection device 6 to the pulse application device 3.

Figure 2:
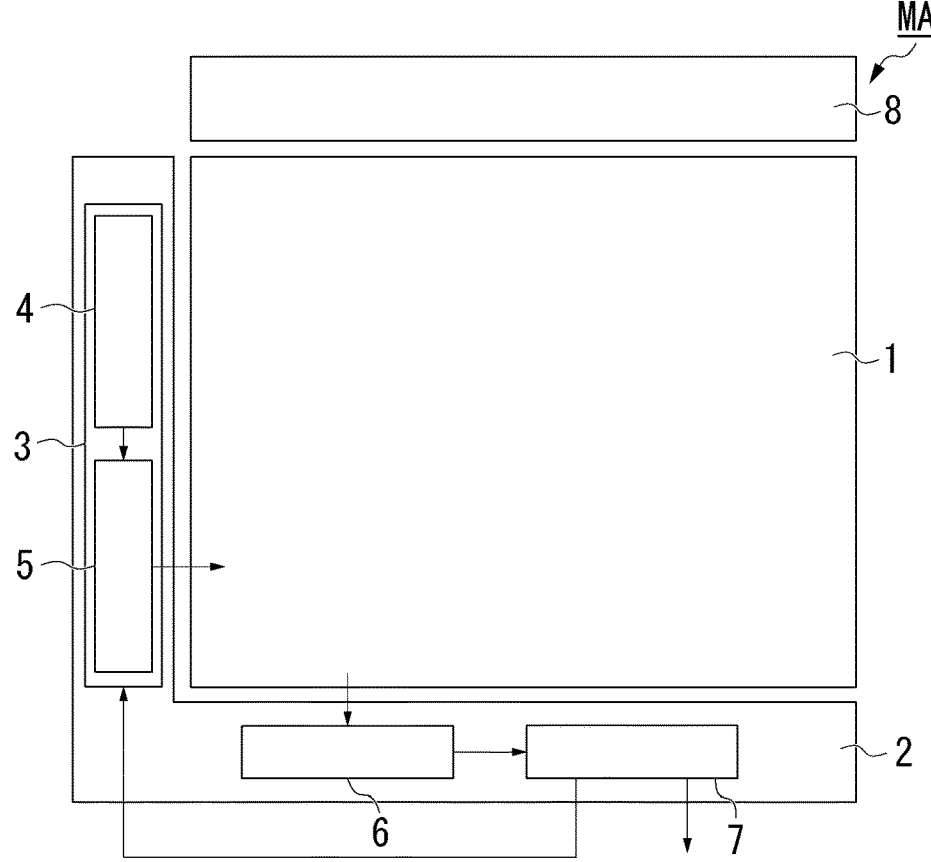
FIG. 2 is a block diagram of another example of the magnetic array according to the first embodiment.

Further, the magnetic array MA may include, as shown in FIG. 2, a magnetic field application device 8. The magnetic field application device 8 applies a magnetic field to each of the plurality of domain wall motion elements in the integrated area 1, for example, in an initialization step to be described later.

Figure 3:
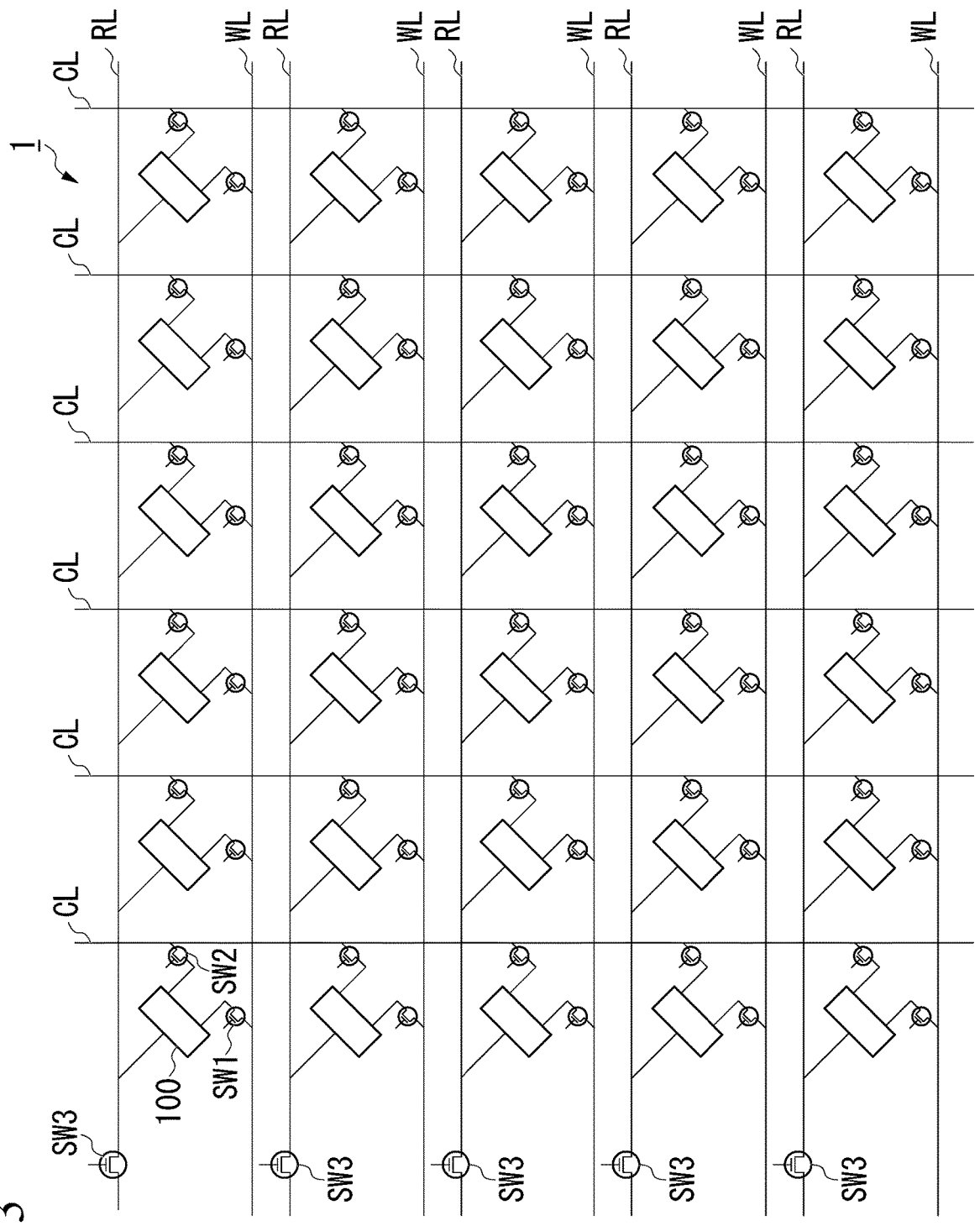
FIG. 3 is a circuit diagram of an integrated area of the magnetic array according to the first embodiment.

FIG. 3 is a circuit diagram of the integrated area 1 according to the first embodiment. The integrated area 1 includes a plurality of domain wall motion elements 100, a plurality of first wirings WL, a plurality of second wirings CL, a plurality of third wirings RL, a plurality of first switching elements SW1, and a plurality of second switching elements SW2. A third switching element SW3 belongs to, for example, the control unit 4 of the peripheral area 2. FIG. 2 also shows the third switching element SW3 for description.

Each of the first wirings WL is a write wiring. Each first wiring WL electrically connects the pulse application device 3 and one or more domain wall motion elements 100. Each second wiring CL is a common wiring that can be used both when writing data and when reading data. Each second wiring CL is connected to, for example, the resistance detection device 6. The second wiring CL may be provided for each of the plurality of domain wall motion elements 100 or may be provided across the plurality of domain wall motion elements 100. Each third wiring RL is a read wiring. Each third wiring RL electrically connects the pulse application device 3 and one or more domain wall motion element 100.

The first switching element SW1, the second switching element SW2, and the third switching element SW3 are elements for controlling current flow. The first switching element SW1, the second switching element SW2, and the third switching element SW3 are, for example, transistors, elements like Ovonic threshold switches (OTS) that use phase change in crystal layers, elements like metal-insulator transition (MIT) switches that use band structure changes, elements like Zener diodes and avalanche diodes that use breakdown voltage, and elements that change conductivity with changes in atomic positions.

The first switching element SW1 and the second switching element SW2 are connected to, for example, each domain wall motion element 100. The first switching element SW1 is connected, for example, between the domain wall motion element 100 and the first wiring WL. The second switching element SW2 is connected, for example, between the domain wall motion element 100 and the second wiring CL. The third switching element SW3 is connected, for example, across the plurality of domain wall motion elements 100. The third switching element SW3 is connected to, for example, the third wiring RL.

The positional relationship of the first switching element SW1, the second switching element SW2, and the third switching element SW3 is not limited to the case shown in FIG. 3. For example, the first switching element SW1 may be connected across the plurality of domain wall motion elements 100 and positioned on the upstream side of the first wiring WL. Further, for example, the second switching element SW2 may be connected across the plurality of domain wall motion elements 100 and positioned on the upstream side of the second wiring CL. Further, for example, the third switching element SW3 may be connected to each domain wall motion element 100.

Figure 4:
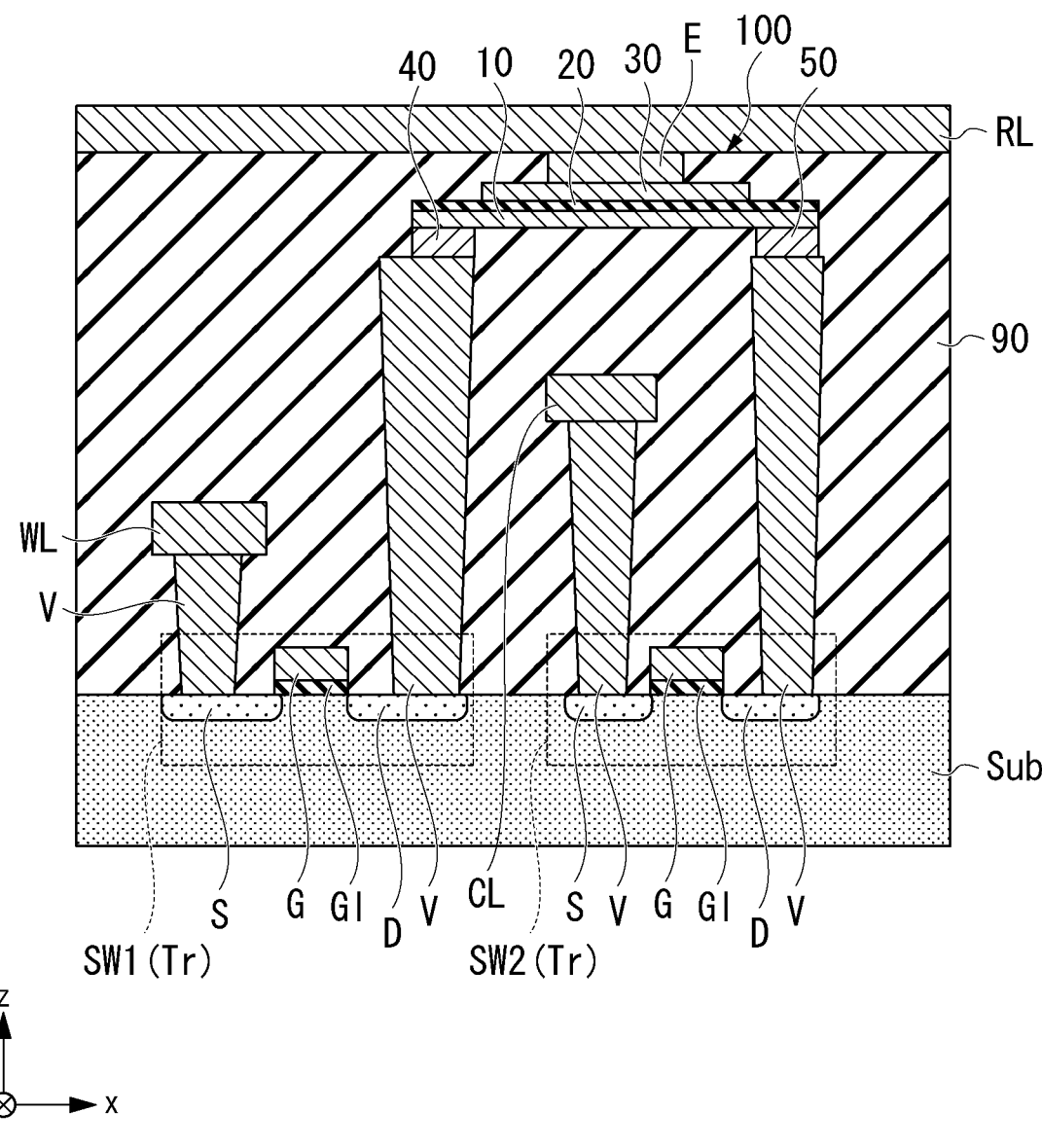
FIG. 4 is a cross-sectional view in the vicinity of a domain wall motion element of the magnetic array according to the first embodiment.

FIG. 4 is a cross-sectional view in the vicinity of the domain wall motion element 100 of the magnetic array MA according to the first embodiment. FIG. 4 is a cross-section in which one domain wall motion element 100 of FIG. 3 is cut along an xz plane passing through the center of the width of the domain wall motion layer 10 in the y direction.

The first switching element SW1 and the second switching element SW2 shown in FIG. 4 are transistors Tr. The transistor Tr includes a gate electrode G, a gate insulating film GI, and a source S and a drain D formed on the substrate Sub. The source S and the drain D are defined by the current flow direction and are the same area. FIG. 4 only shows an example, and the positional relationship between the source S and the drain D may be reversed. The substrate Sub is, for example, a semiconductor substrate. The third switching element SW3 is electrically connected to the third wiring RL and is at a position deviated in the x direction, for example, in FIG. 4.

The transistors Tr, the first wirings WL, the second wirings CL, the third wirings RL, and the domain wall motion elements 100 in different layers in the z direction are connected by via wirings V extending in the z direction. The via wiring V contains a material having conductivity. An insulating layer 90 is formed between different layers in the z direction except for the via wiring V.

The insulating layer 90 is an insulating layer that insulates between wirings of multilayer wiring and between elements. The domain wall motion element 100 and the transistor Tr are electrically separated by the insulating layer 90 except for the via wiring V. The insulating layer 90 is made of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), and the like.

Figure 5:
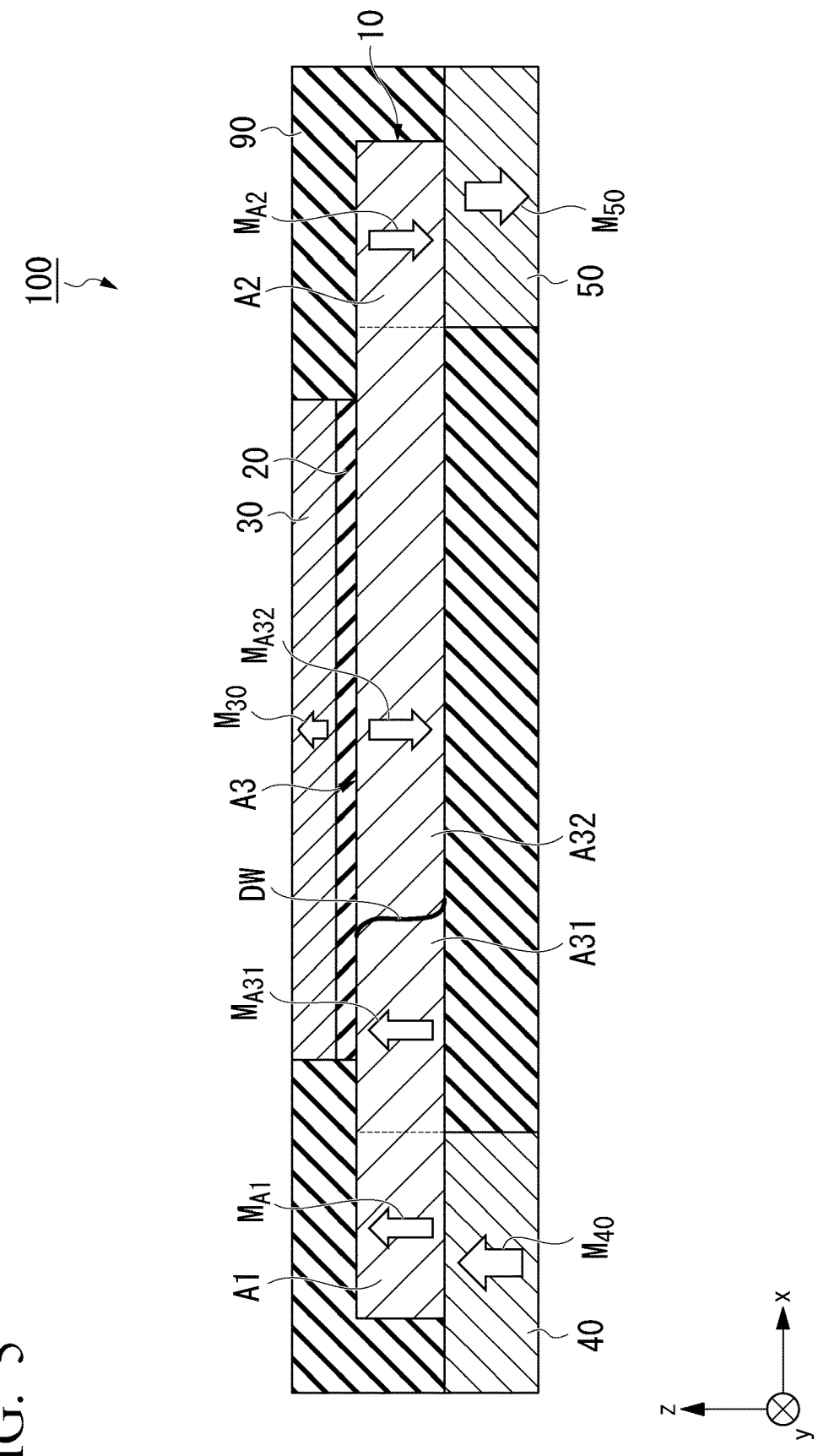
FIG. 5 is a cross-sectional view of a first example of the domain wall motion element according to the first embodiment.
Figure 6:
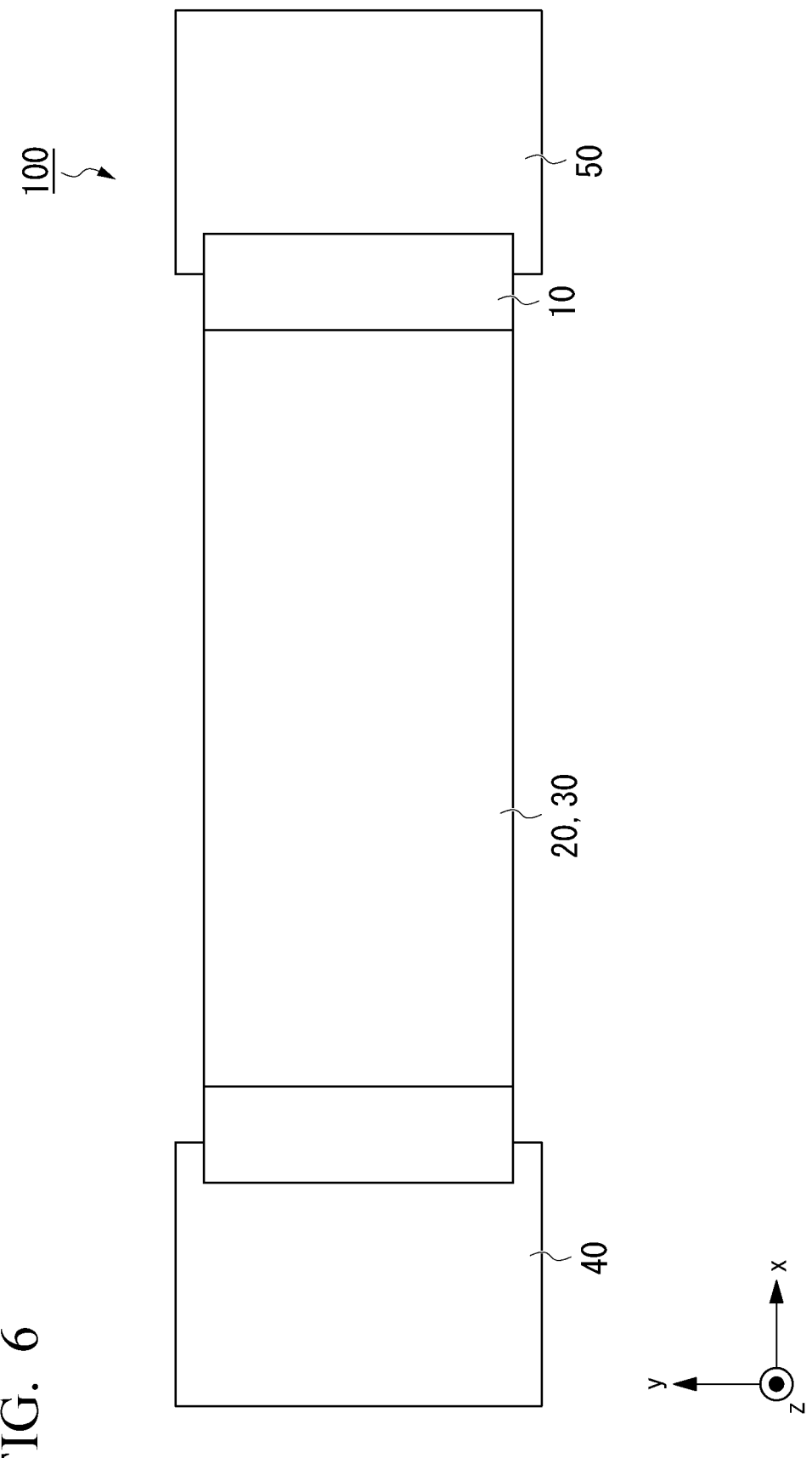
FIG. 6 is a plan view of the first example of the domain wall motion element according to the first embodiment.

FIG. 5 is a cross-sectional view in which the domain wall motion element 100 is cut along the xz plane passing through the center of the domain wall motion layer 10 in the y direction. The arrow shown in the drawing is an example of the orientation direction of the ferromagnetic material. FIG. 6 is a plan view in which the domain wall motion element 100 is viewed from the z direction.

The domain wall motion element 100 includes the domain wall motion layer 10, a non-magnetic layer 20, a ferromagnetic layer 30, a first magnetization fixed layer 40, and a second magnetization fixed layer 50.

The domain wall motion layer 10 extends in the x direction. The domain wall motion layer 10 has a plurality of magnetic domains therein and domain walls DW at the boundaries of the plurality of magnetic domains. The domain wall motion layer 10 is, for example, a layer that can magnetically store information by changing its magnetic state. The domain wall motion layer 10 is also called an analog layer or a magnetic storage layer.

The domain wall motion layer 10 has a first area A1, a second area A2, and a third area A3. The first area A1 is an area which overlaps the first magnetization fixed layer 40 when viewed from the z direction. The second area A2 is an area which overlaps the second magnetization fixed layer 50 when viewed from the z direction. The third area A3 is an area of the domain wall motion layer 10 except for the first area A1 and the second area A2. The third area A3 is, for example, an area sandwiched between the first area A1 and the second area A2 in the x direction.

The magnetization MAI of the first area A1 is fixed by the magnetization $M_{40}$ of the first magnetization fixed layer 40. The magnetization $M_{42}$ of the second area A2 is fixed by the magnetization $M_{50}$ of the second magnetization fixed layer 50. The fixed magnetization means that the magnetization is not reversed in the normal operation of the domain wall motion element 100 (no external force beyond assumption is applied). For example, the magnetization orientation directions of the first area A1 and the second area A2 are opposite to each other.

The third area A3 is an area in which the magnetization direction changes and a domain wall DW can move. The third area A3 is called a domain wall movable area. The third area A3 has a first magnetic domain A31 and a second magnetic domain A32. The magnetization orientation directions of the first magnetic domain A31 and the second magnetic domain A32 are opposite to each other. The boundary between the first magnetic domain A31 and the second magnetic domain A32 is the domain wall DW. For example, the magnetization $M_{A31}$ of the first magnetic domain A31 is oriented in the same direction as that of the magnetization $M_{A1}$ of the first area A1. For example, the magnetization $M_{A32}$ of the second magnetic domain A32 is oriented in the same direction as the magnetization $M_{A2}$ of the adjacent second area A2. In principle, the domain wall DW moves in the third area A3 and does not enter the first area A1 and the second area A2.

When the volume ratio between the first magnetic domain A31 and the second magnetic domain A32 in the third area A3 changes, the domain wall DW moves. The domain wall DW moves by applying a write current in the x direction of the third area A3, applying an external magnetic field to the third area A3, or the like. For example, since electrons flow in the −x direction opposite to the current when a write current (for example, a current pulse) is applied to the third area A3 in the +x direction, the domain wall DW moves in the −x direction. When a current flows from the first magnetic domain A31 to the second magnetic domain A32, electrons spin-polarized in the second magnetic domain A32 reverse the magnetization $M_{A31}$ of the first magnetic domain A31. As the magnetization $M_{A31}$ of the first magnetic domain A31 is reversed, the domain wall DW moves in the −x direction.

The domain wall motion layer 10 is made of a magnetic material. The domain wall motion layer 10 may be a ferromagnetic material, a ferrimagnetism material, or a combination thereof with an antiferromagnetic material capable of changing the magnetic state by an electric current. The domain wall motion layer 10 preferably contains at least one element selected from the group consisting of Co, Ni, Fe, Pt, Pd, Gd, Tb, Mn, Ge, and Ga. Materials used for the domain wall motion layer 10 include, for example, a laminated film of Co and Ni, a laminated film of Co and Pt, a laminated film of Co and Pd, an MnGa-based material, a GdCo-based material, and a TbCo-based material. Ferrimagnetism materials such as MnGa-based materials, GdCo-based materials, and TbCo-based materials have small saturation magnetization, and the threshold current required to move the domain wall DW is small. In addition, the laminated film of Co and Ni, the laminated film of Co and Pt, and the laminated film of Co and Pd have a large coercive force, and the moving speed of the domain wall DW becomes slow. The antiferromagnetic material is, for example, $Mn_3X$ (X is Sn, Ge, Ga, Pt, Ir, or the like), CuMnAs, $Mn_2Au$, or the like. A material similar to that of the ferromagnetic layer 30 to be described later can also be applied to the domain wall motion layer 10.

The non-magnetic layer 20 is positioned between the domain wall motion layer and the ferromagnetic layer 30. The non-magnetic layer 20 is laminated on one surface of the ferromagnetic layer 30.

The non-magnetic layer 20 is made of, for example, a non-magnetic insulator, semiconductor, or metal. Non-magnetic insulators are, for example, $Al_2O_3$, $SiO_2$, MgO, $MgAl_2O_4$, and materials in which a part of Al, Si, and Mg are replaced with Zn, Be, and the like. These materials have a large bandgap and excellent insulating properties. When the non-magnetic layer 20 is made of a non-magnetic insulator, the non-magnetic layer 20 is a tunnel barrier layer. Non-magnetic metals are, for example, Cu, Au, Ag, and the like. Non-magnetic semiconductors are, for example, Si, Ge, $CuInSe_2$, $CuGaSe_2$, $Cu(In, Ga)Se_2$, and the like.

The thickness of the non-magnetic layer 20 is, for example, 20 Å or more, and may be 25 Å or more. When the non-magnetic layer 20 is thick, the resistance area (RA) of the domain wall motion element 100 is increased. The resistance area (RA) of the domain wall motion element 100 is preferably $1 \times 10^4$ $\Omega \mu m^2$ or more and more preferably $5 \times 10^4$ $\Omega \mu m^2$ or more. The resistance area (RA) of the domain wall motion element 100 is expressed by the product of the element resistance of one domain wall motion element 100 and the element cross-sectional area of the domain wall motion element 100 (the area of the cross-section obtained by cutting the non-magnetic layer 20 along the xy plane).

The ferromagnetic layer 30 sandwiches the non-magnetic layer 20 together with the domain wall motion layer 10. The ferromagnetic layer 30 is at a position in which at least a part overlaps the domain wall motion layer 10 in the z direction. The magnetization of the ferromagnetic layer 30 is more difficult to reverse than the magnetization of the third area A3 of the domain wall motion layer 10. The magnetization direction of the ferromagnetic layer 30 is not changed and is fixed when an external force that reverses the magnetization of the third area A3 is applied. The ferromagnetic layer 30 is sometimes called a fixed layer and a reference layer.

The ferromagnetic layer 30 contains a ferromagnetic material. The ferromagnetic layer 30 contains, for example, a material that easily obtains a coherent tunnel effect with the domain wall motion layer 10. The ferromagnetic layer 30 contains, for example, a metal selected from the group consisting of Cr, Mn, Co, Fe, and Ni, an alloy containing one or more of these metals, an alloy containing these metals and at least one or more elements of B, C, and N, and the like. The ferromagnetic layer 30 is, for example, Co—Fe, Co—Fe—B, and Ni—Fe.

The ferromagnetic layer 30 may be, for example, a Heusler alloy. The Heusler alloy is half-metal and has high spin polarization. The Heusler alloy is an intermetallic compound with a chemical composition of XYZ or $X_2YZ$, X is a Co, Fe, Ni, or Cu group transition metal element or noble metal element on the periodic table, Y is a Mn, V, Cr, or Ti group transition metal or an element species of X, and Z is a typical element of Groups III to V. Examples of Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

The first magnetization fixed layer 40 and the second magnetization fixed layer 50 are connected to the domain wall motion layer 10. The first magnetization fixed layer 40 and the second magnetization fixed layer 50 are separated from each other in the x direction. The first magnetization fixed layer 40 fixes the magnetization of the first area A1. The second magnetization fixed layer 50 fixes the magnetization of the second area A2.

The first magnetization fixed layer 40 and the second magnetization fixed layer 50 are made of, for example, ferromagnetic materials. For example, the same material as that of the domain wall motion layer 10 or the ferromagnetic layer 30 can be applied to the first magnetization fixed layer 40 and the second magnetization fixed layer 50. Also, the first magnetization fixed layer 40 and the second magnetization fixed layer 50 are not limited to ferromagnetic materials. When the first magnetization fixed layer 40 and the second magnetization fixed layer 50 are not made of ferromagnetic materials, the current density of the current flowing through the domain wall motion layer 10 abruptly changes in an area overlapping the first magnetization fixed layer 40 or the second magnetization fixed layer 50, so that the movement of the domain wall DW is limited and the magnetizations of the first area A1 and the second area A2 are fixed.

The domain wall motion element 100 may have layers other than the domain wall motion layer 10, the non-magnetic layer 20, and the ferromagnetic layer 30. For example, a magnetic layer may be provided on the surface of the ferromagnetic layer 30 opposite to the non-magnetic layer 20 via a spacer layer. The ferromagnetic layer 30, the spacer layer, and the magnetic layer have a synthetic anti-ferromagnetic structure (SAF structure). The synthetic anti-ferromagnetic structure consists of two magnetic layers sandwiching a non-magnetic layer. By antiferromagnetic coupling between the ferromagnetic layer 30 and the magnetic layer, the coercive force of the ferromagnetic layer 30 is larger than that when magnetic layer is not provided. The magnetic layer contains, for example, a ferromagnetic material, and may contain an antiferromagnetic material such as IrMn and PtMn. For example, the spacer layer contains at least one selected from the group consisting of Ru, Ir, and Rh.

The magnetization direction of each layer of the domain wall motion element 100 can be confirmed, for example, by measuring a magnetization curve. The magnetization curve can be measured using, for example, MOKE (Magneto Optical Kerr Effect). The measurement using MOKE is a measurement method in which linearly polarized light is incident on a measurement object and a magneto-optical effect (magnetic Kerr effect) in which the polarization direction of the object is caused to rotate is used.

Figure 7:
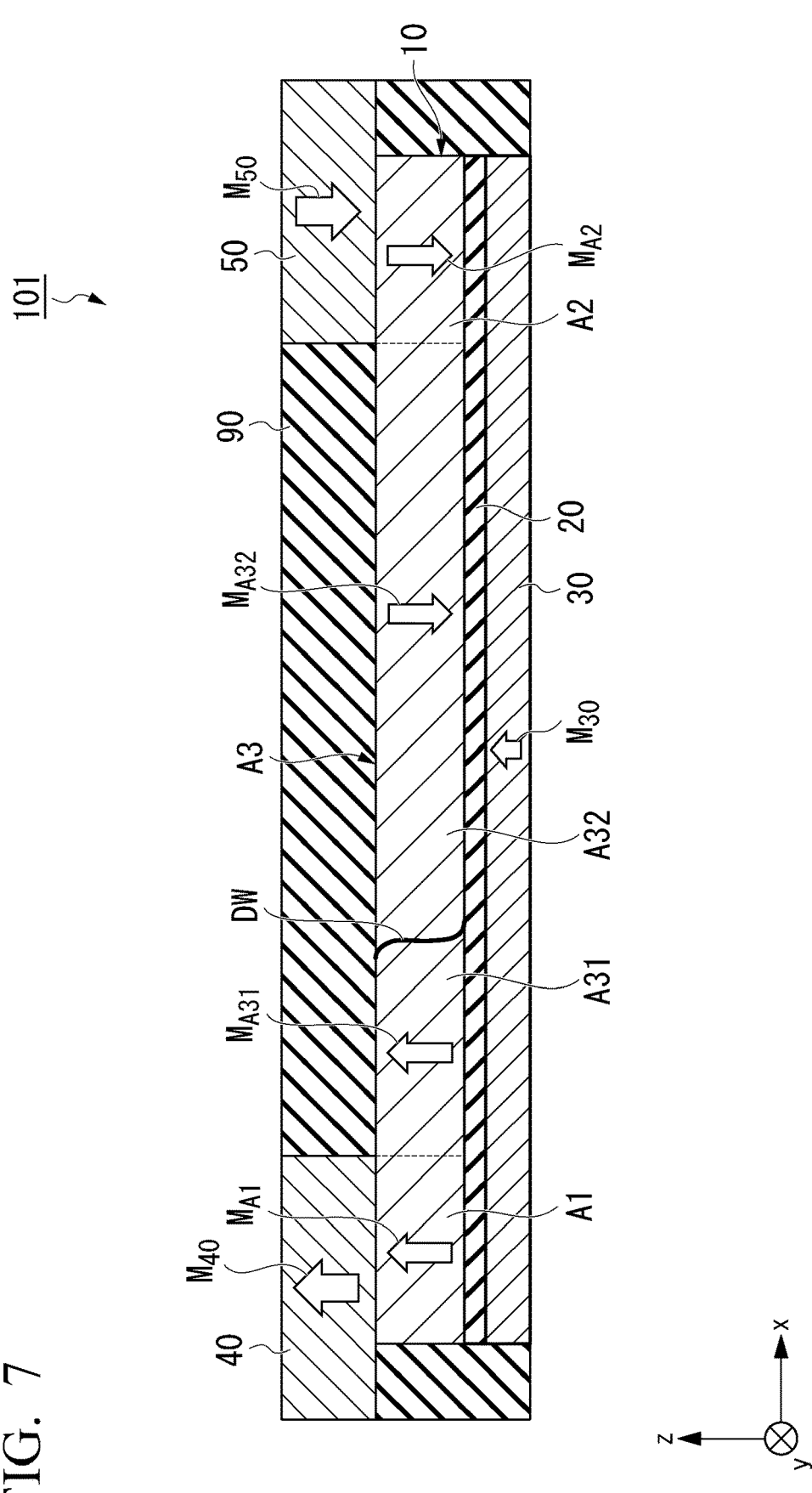
FIG. 7 is a cross-sectional view of a second example of the domain wall motion element according to the first embodiment.

So far, an example of a specific configuration of the domain wall motion element has been described using the domain wall motion element 100 shown in FIG. 5 as an example, but the structure of the domain wall motion element is not limited to this case. FIG. 7 is a cross-sectional view in which a domain wall motion element 101 according to a second example is cut along an xz plane passing through the center of the domain wall motion layer 10 in the y direction. The domain wall motion element 101 shown in FIG. 7 is different from the domain wall motion element 100 in that the ferromagnetic layer 30 is closer to the substrate Sub than the domain wall motion layer 10. The domain wall motion element 101 is called a bottom pin structure in which the ferromagnetic layer 30 serving as a fixed layer is close to the substrate Sub. The domain wall motion element 100 is called a top pin structure in which the ferromagnetic layer 30 serving as a fixed layer is farther from the substrate Sub than the domain wall motion layer 10. The domain wall motion element 100 can be replaced with the domain wall motion element 101.

The domain wall motion element 100 is formed by laminating each layer and processing a part of each layer into a predetermined shape. A sputtering method, a chemical vapor deposition (CVD) method, an electron beam vapor deposition method (EB vapor deposition method), an atomic laser deposition method, or the like can be used for laminating each layer. Each layer can be processed using photolithography and etching (for example, Ar etching).

Figure 8:
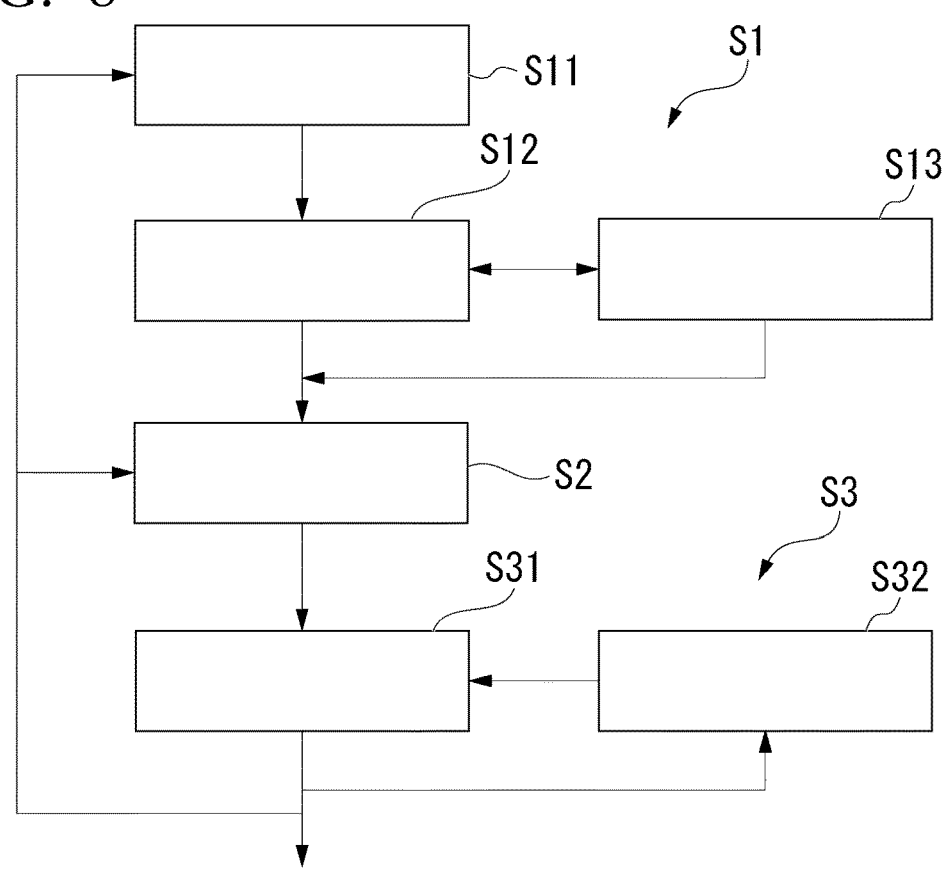
FIG. 8 is a control flowchart of the magnetic array according to the first embodiment.

Next, the operation and control of the magnetic array MA according to this embodiment will be described. FIG. 8 is an operation flow diagram of the magnetic array MA.

The method of controlling the magnetic array MA includes, for example, an initialization step S1, a resistance detection step S2, and an operation step S3. The resistance detection step S2 may be omitted.

The initialization step S1 is a step of initializing each of the plurality of domain wall motion elements 100 in the magnetic array MA. The initialization of the domain wall motion element 100 moves the position of the domain wall DW of the domain wall motion element 100 to the initial position. The initial position of the domain wall DW may be different for each domain wall motion element 100. The initialization step S1 is performed, for example, based on the initialization program stored in the control unit 4 of the pulse application device 3. The initialization program instructs the control unit 4 to initialize the magnetic array MA and performs the initialization step S1.

The initialization step S1 includes, for example, a first step S11, a second step S12, and a third step S13. The first step S11 is a step of setting the initial distribution of the resistance values of the plurality of domain wall motion elements 100. The second step S12 is a step of spreading the distribution of the resistance values of the plurality of domain wall motion elements 100 from the initial distribution. The third step S13 is a step of shifting the mode value of the distribution of the resistance values. The third step S13 may be omitted. Further, the second step S12 may be performed again after the third step S13.

First, in the first step S11, the initial distribution of the resistance values of the plurality of domain wall motion elements 100 is set. The initial distribution of the resistance values is set by moving the position of the domain wall DW of each domain wall motion element 100 to a predetermined position. For example, the first step S11 is performed based on the first program stored in the control unit 4 of the pulse application device 3. The first program sets the initial distribution of the resistance values of the plurality of domain wall motion elements 100.

The movement of the domain wall DW in the first step S11 may be performed by applying a magnetic field to the domain wall motion element 100 or by applying a pulse to the domain wall motion layer 10. The magnetic field is applied by using, for example, the magnetic field application device 8. The pulse is applied by using, for example, the pulse application device 3. The pulse applied in the first step S11 is a third pulse. The third pulse is one of the initialization pulses. The magnetic field or third pulse is applied to, for example, the plurality of domain wall motion elements 100 at the same time.

Figure 9:
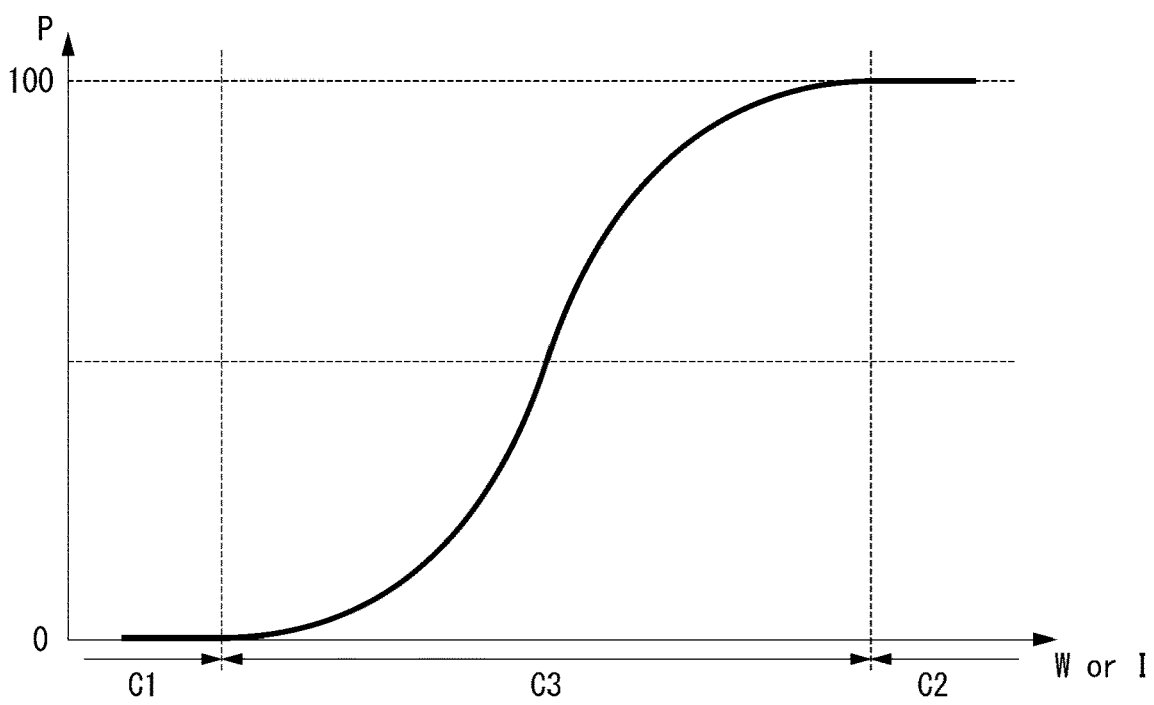
FIG. 9 is a graph showing a relationship between a pulse applied to a domain wall motion layer and a probability of movement of a domain wall.

FIG. 9 is a graph showing a relationship between the pulse applied to the domain wall motion layer 10 and the probability of movement of the domain wall DW. The horizontal axis of FIG. 9 is the pulse length (pulse length) or pulse intensity (voltage), and the vertical axis is the probability that the domain wall DW moves (the probability that the magnetization $M_{A31}$ or the magnetization $M_{A32}$ is reversed).

When the pulse applied to the domain wall motion layer 10 is sufficiently small, the domain wall DW does not move even when a pulse is applied to the domain wall motion layer 10. A condition that the probability of movement of the domain wall DW when a pulse is applied is 0% is called a first condition C1. When the pulse applied to the domain wall motion layer 10 is sufficiently large, the domain wall DW moves if a pulse is applied to the domain wall motion layer 10. A condition that the probability of movement of the domain wall DW when a pulse is applied is 100% is called a second condition C2. When the pulse applied to the domain wall motion layer 10 is between the first condition C1 and the second condition C2, the domain wall DW may not move if a pulse is applied to the domain wall motion layer 10. Whether or not the domain wall DW moves is determined stochastically. A condition that the probability of movement of the domain wall DW when a pulse is applied is larger than 0% and smaller than 100% is called a third condition C3. Here, the probability of movement of the domain wall DW is defined as 0% when the domain wall DW does not move even once when the pulse is applied ten times and is defined as 100% when the domain wall DW moves in any case and the case therebetween is defined to be larger than 0% and smaller than 100%.

The third pulse applied in the first step S11 is the second condition C2 or the third condition C3. The third pulse is preferably the second condition C2. The third pulse preferably has a longer pulse length or a higher voltage than the first pulse to be described later.

Figure 10:
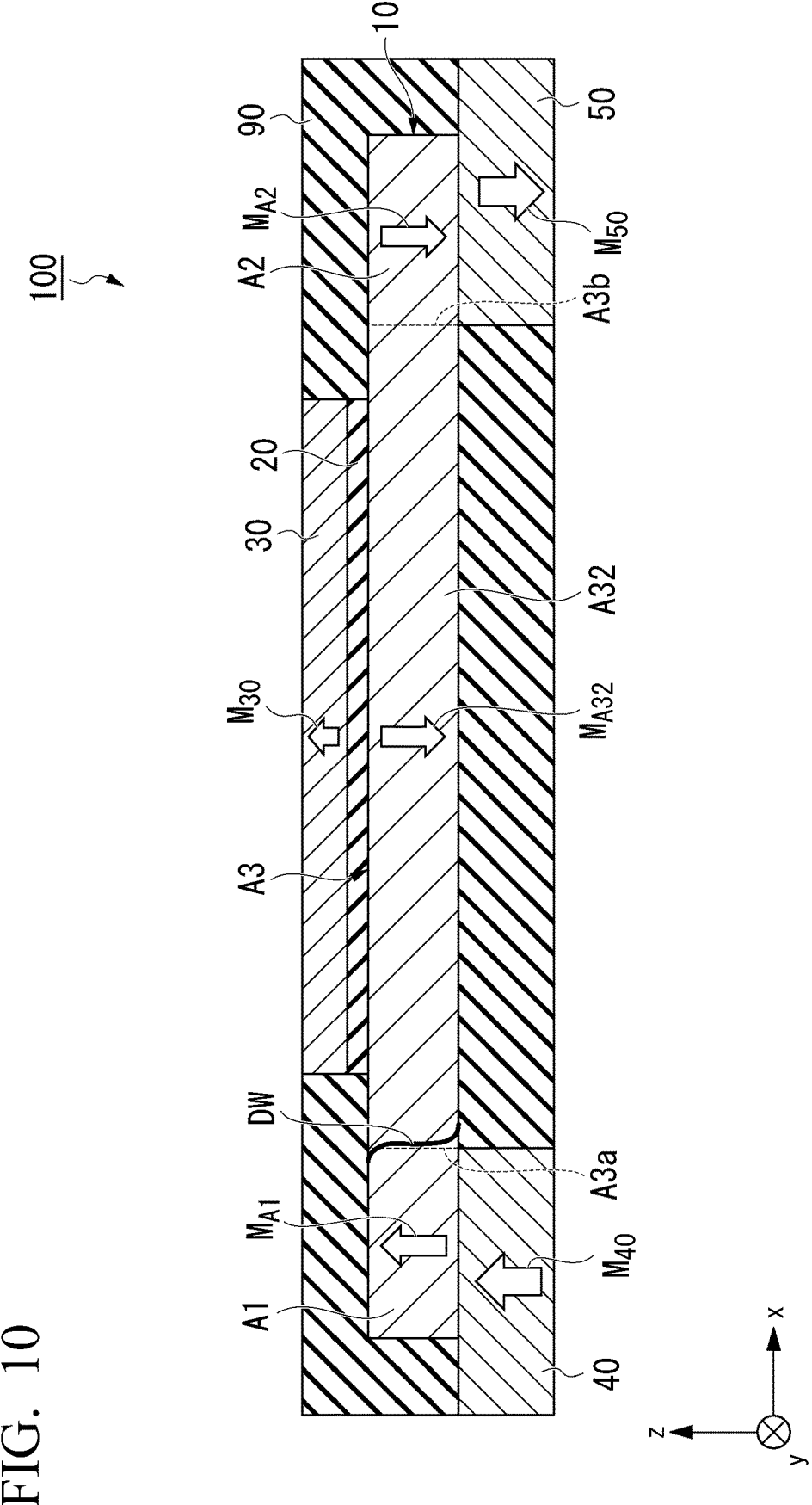
FIG. 10 is a first example of a state of the domain wall motion element after performing a first step in the magnetic array according to the first embodiment.

FIG. 10 is a first example of the domain wall motion element 100 after performing the first step S11. In the first example, the domain wall DW is moved to a first end A3a of the third area A3 which is the domain wall movable area. When the domain wall DW is moved by using the third pulse, the number of times of applying the third pulse is preferably equal to or larger than the number of times of applying the pulse required to move the domain wall DW from the first end A3a to the second end A3b using the pulse of the second condition C2. This is for reliably bringing the domain wall DW closer to the first end A3a or the second end A3b of the third area A3. An example of the pulse of the second condition C2 is an operation pulse applied in an operation step to be described later.

When the domain wall DW moves to the first end A3a, the third area A3 becomes only the second magnetic domain A32. Since the magnetization $M_{32}$ of the second magnetic domain A32 and the magnetization $M_{30}$ of the ferromagnetic layer 30 are in an antiparallel relationship, the resistance value of the domain wall motion element 100 becomes the maximum value.

Figure 11:
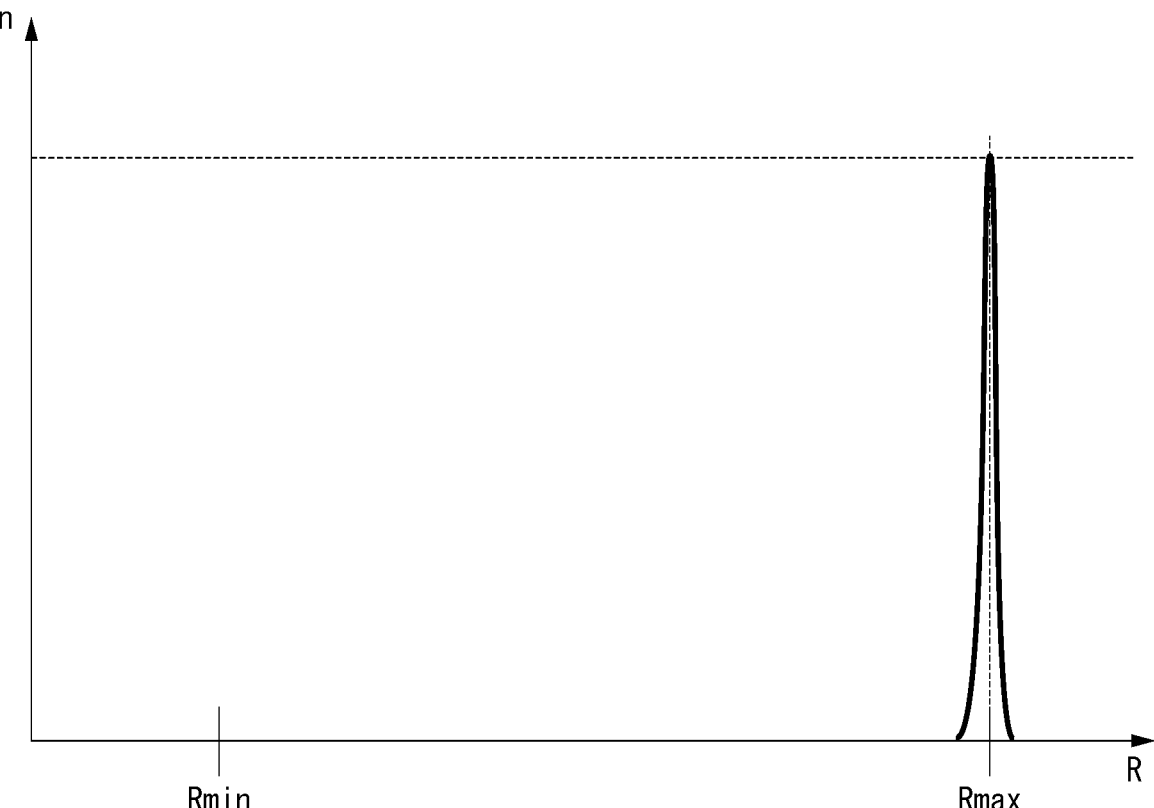
FIG. 11 is an initial distribution of a resistance value in the case of the first example shown in FIG. 10.

FIG. 11 is an initial distribution of the resistance values in the case of the first example shown in FIG. 10. The horizontal axis of FIG. 11 is the resistance value of each domain wall motion element 100 and the vertical axis is the number of the domain wall motion elements 100 showing the resistance value. Each of the plurality of domain wall motion elements 100 exhibits a maximum value in principle, but has some variation. The initial distribution of the resistance values is distributed with, for example, the mean value of the maximum resistance values of the plurality of domain wall motion elements 100 as the mode value.

Figure 12:
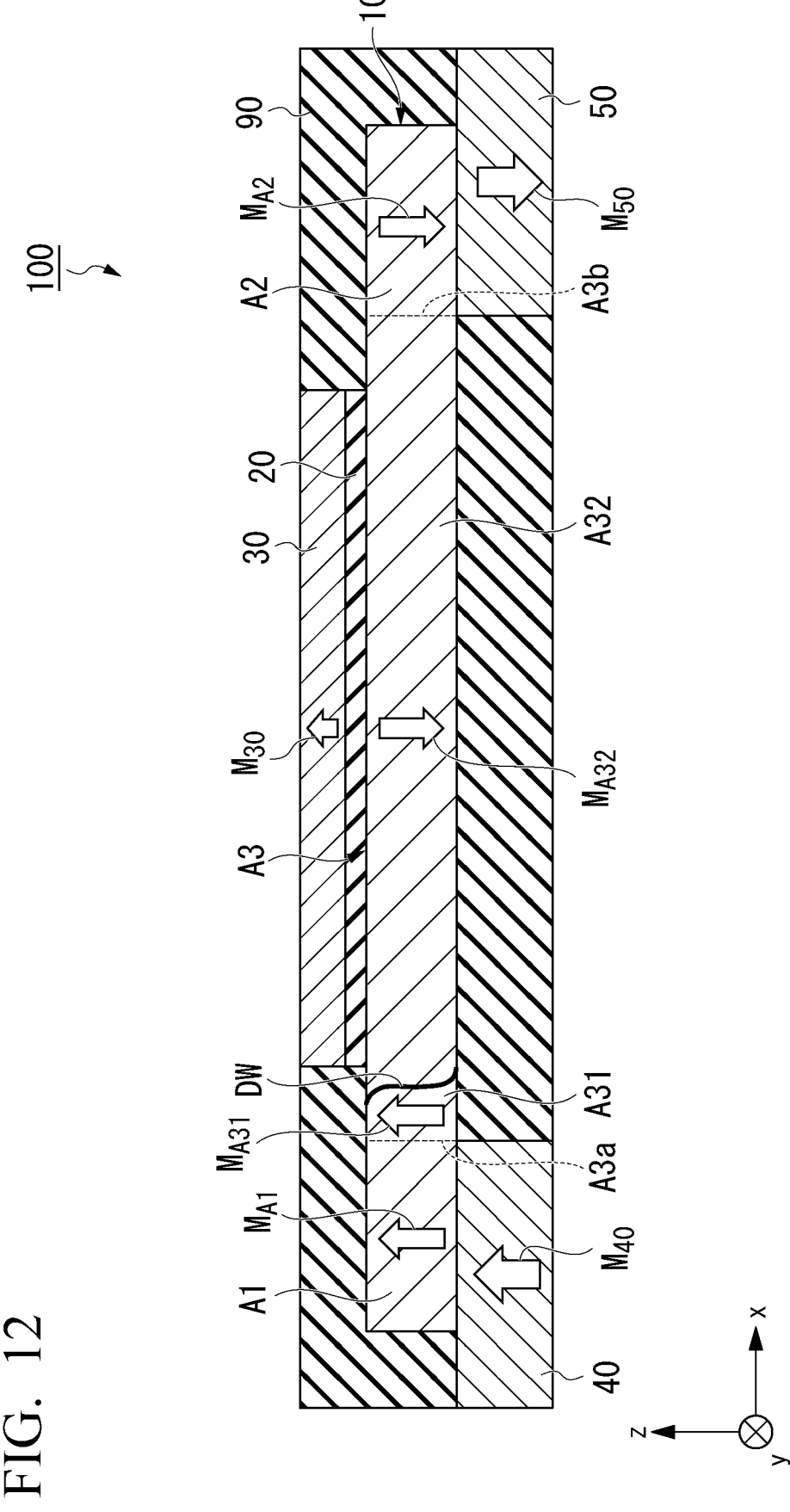
FIG. 12 is a second example of a state of the domain wall motion element after performing the first step in the magnetic array according to the first embodiment.

Further, FIG. 12 is a second example of the domain wall motion element 100 after performing the first step S11. In the second example, the domain wall DW is between the first end A3a and the end portion of the ferromagnetic layer 30 in the x direction. The resistance value of the domain wall motion element 100 changes according to the relative angle of magnetizations of the two ferromagnetic layers facing each other. In the case of the second example, the domain wall DW is positioned so as not to overlap the ferromagnetic layer 30, and the magnetization $M_{32}$ of the second magnetic domain A32 and the magnetization $M_{30}$ of the ferromagnetic layer 30 are in an antiparallel relationship, the resistance value of the domain wall motion element 100 becomes the maximum value. Thus, the initial distribution of the resistance values in the case of the second example is the same as that of the case of the first example. Therefore, the initial distribution of the resistance values is distributed with the mean value of the maximum resistance values of the domain wall motion elements as the mode value.

Figure 13:
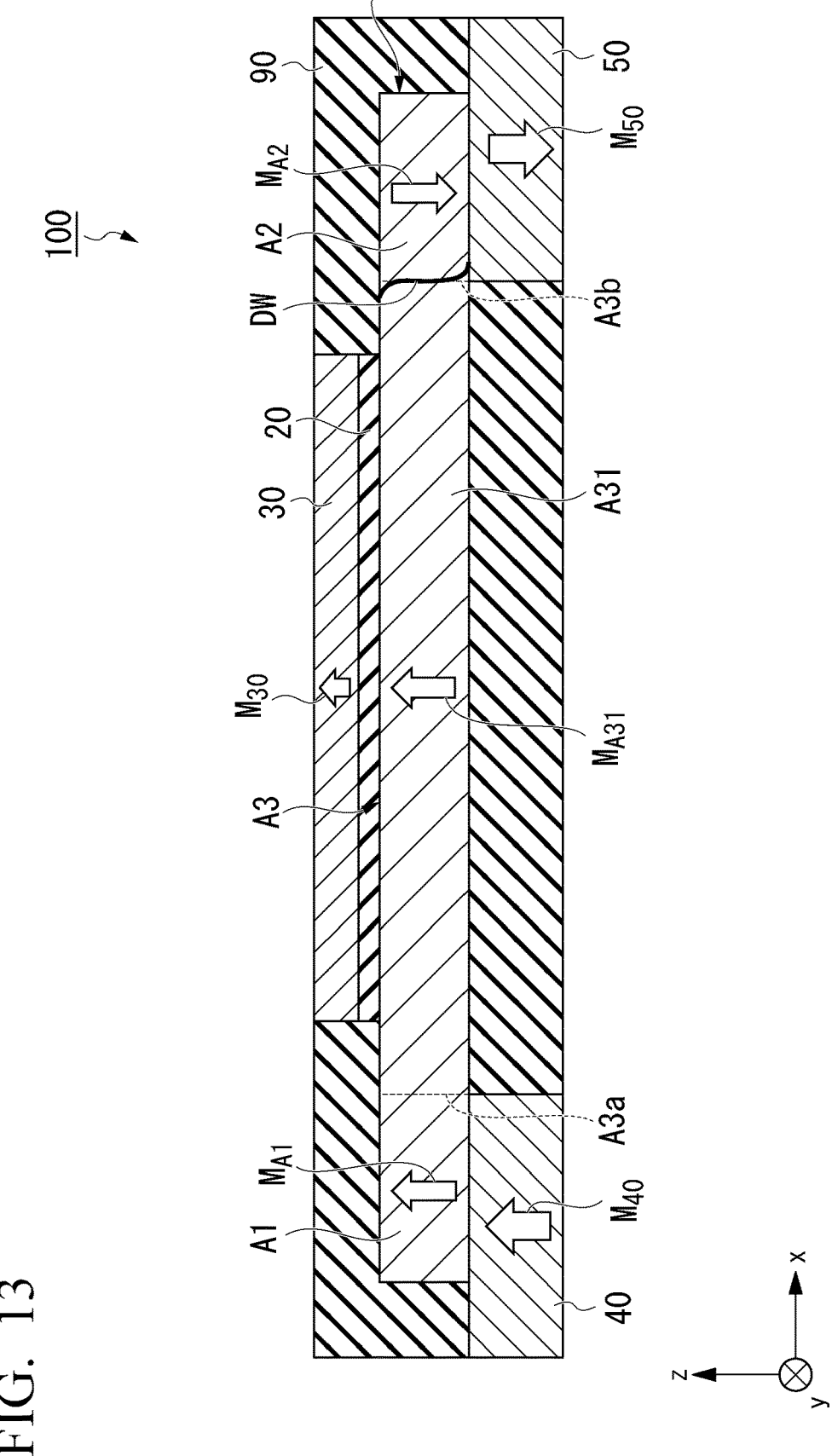
FIG. 13 is a third example of a state of the domain wall motion element after performing the first step in the magnetic array according to the first embodiment.

FIG. 13 is a third example of the domain wall motion element 100 after performing the first step S11. In the third example, the domain wall DW is moved to the second end A3b of the third area A3 which is the domain wall movable area. When the domain wall DW moves to the second end A3b, the third area A3 becomes only the first magnetic domain A31. Since the magnetization $M_{31}$ of the first magnetic domain A31 and the magnetization $M_{30}$ of the ferromagnetic layer 30 are in a parallel relationship, the resistance value of the domain wall motion element 100 becomes the minimum value.

Figure 14:
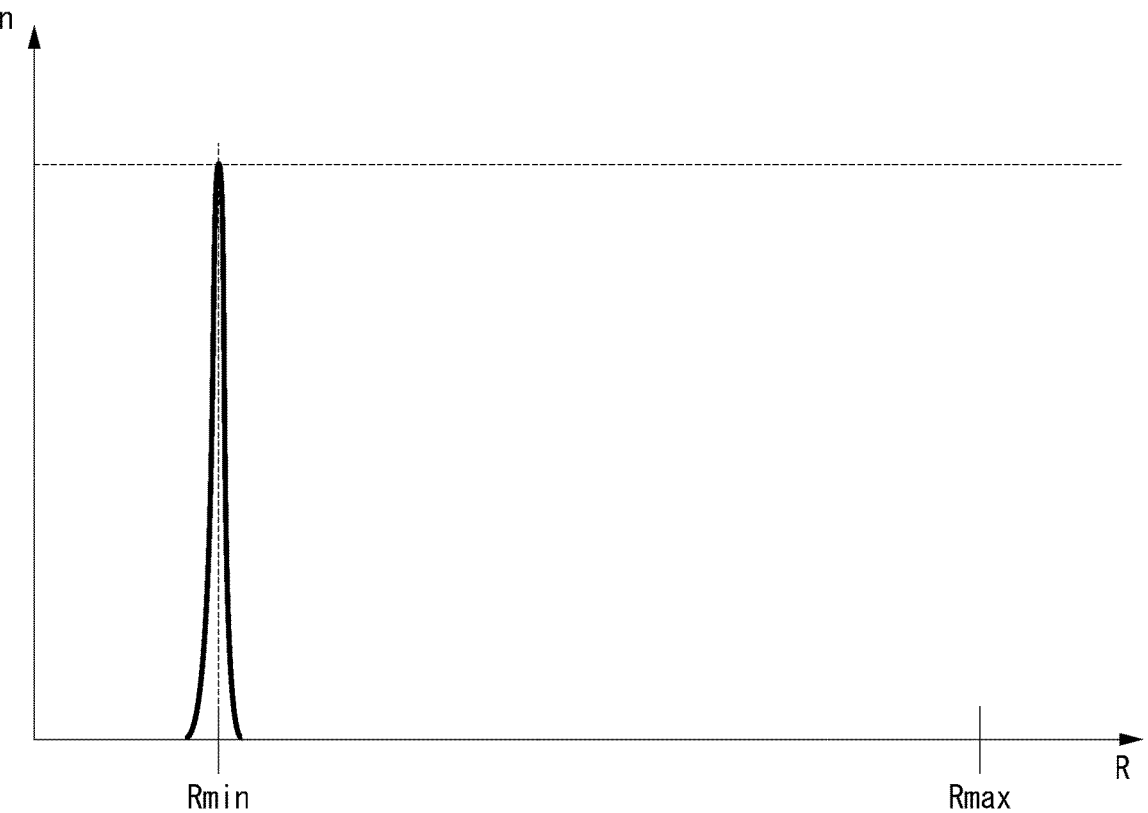
FIG. 14 is an initial distribution of a resistance value in the case of the third example shown in FIG. 13.

FIG. 14 is an initial distribution of the resistance values in the case of the third example shown in FIG. 13. The horizontal axis of FIG. 14 is the resistance value of each domain wall motion element 100 and the vertical axis is the number of the domain wall motion elements 100 showing the resistance value. Each of the plurality of domain wall motion elements 100 exhibits a minimum value in principle, but has some variation. For example, the initial distribution of the resistance value is distributed with the mean value of the minimum resistance values of the domain wall motion elements as the mode value. Further, the same applies to the case in which the domain wall DW is between the second end A3b and the end portion of the ferromagnetic layer 30 in the x direction.

Figure 15:
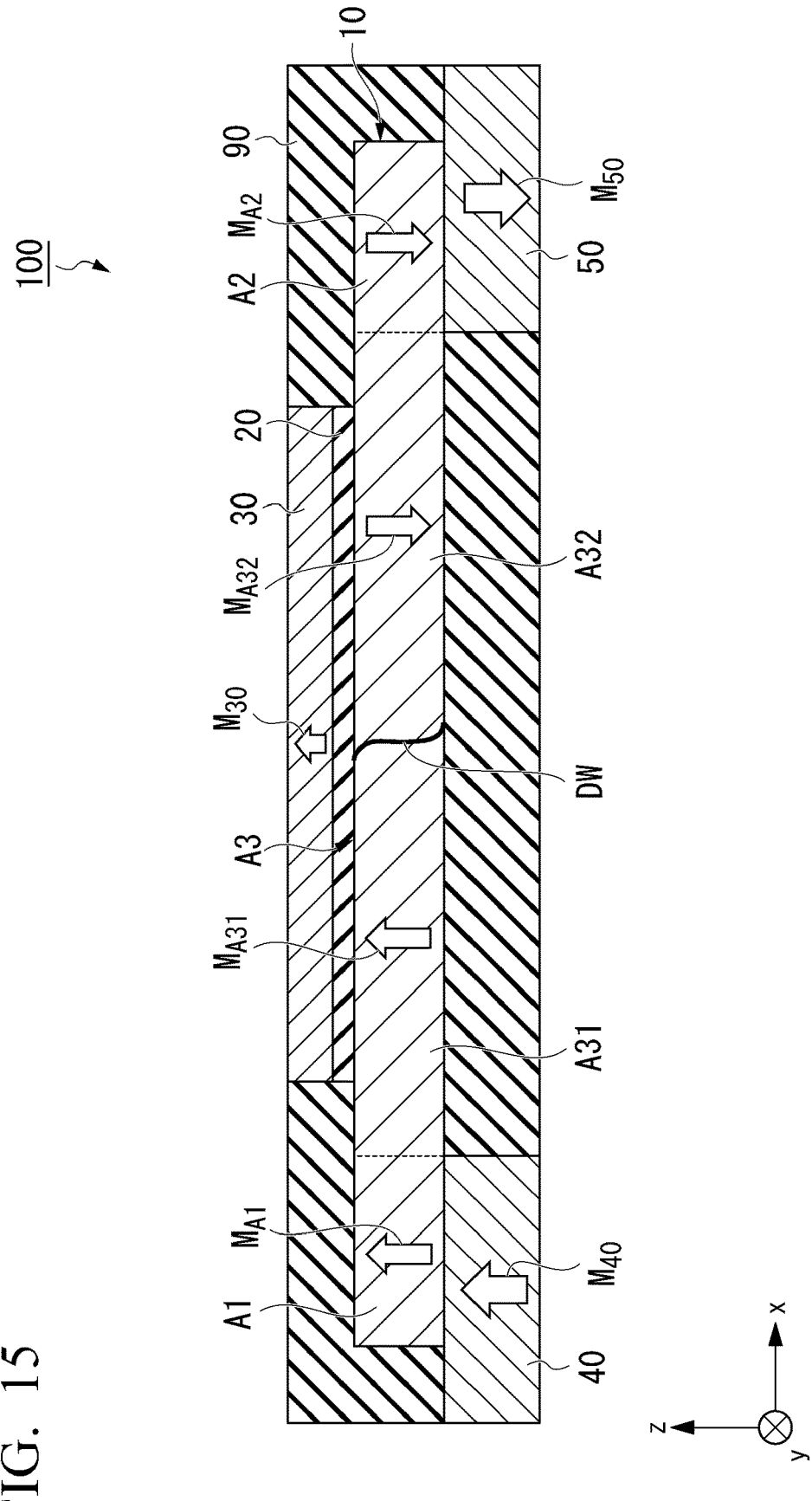
FIG. 15 is a fourth example of a state of the domain wall motion element after performing the first step in the magnetic array according to the first embodiment.

FIG. 15 is a fourth example of the domain wall motion element 100 after performing the first step S11. In the fourth example, the domain wall DW is moved close to the center of the area overlapping the ferromagnetic layer 30 in the third area A3. The resistance value of each domain wall motion element 100 becomes close to the median value of the maximum value and the minimum value of the resistance value of each domain wall motion element.

Figure 16:
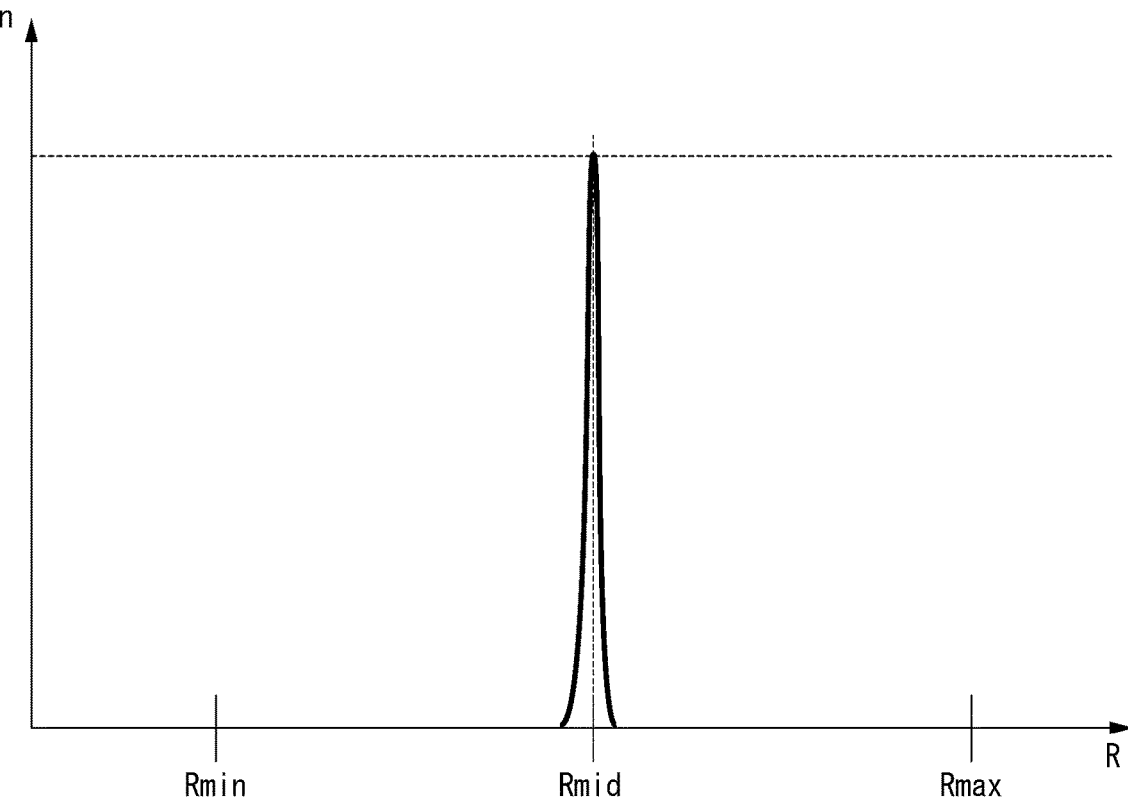
FIG. 16 is an initial distribution of a resistance value in the case of the fourth example shown in FIG. 15.

FIG. 16 is an initial distribution of the resistance values in the case of the fourth example shown in FIG. 15. The horizontal axis of FIG. 16 is the resistance value of each domain wall motion element 100 and the vertical axis is the number of the domain wall motion elements 100 showing the resistance value. The mode value of the initial distribution of the resistance values is in the vicinity of the median value between the mean value of the maximum resistance value of each domain wall motion element and the mean value of the minimum resistance value of each domain wall motion element. The vicinity of the median value means that a deviation of 30% of the difference between the mean value of the maximum resistance value and the mean value of the minimum resistance value from the median value is allowed.

Next, the distribution of the resistance values of the plurality of domain wall motion elements 100 spreads from the initial distribution in the second step S12. To spread the distribution of resistance values means to increase the variation in resistance values. When the distribution of the resistance values spreads, the half width of the distribution spreads. It is preferable that the distribution of the resistance values, for example, approach a normal distribution and become a normal distribution.

For example, the distribution of the resistance values spreads by changing the position of the domain wall DW in each domain wall motion element 100. The second step S12 is performed based on, for example, a second program stored in the control unit 4 of the pulse application device 3. The second program instructs each of the plurality of domain wall motion elements 100 to apply a pulse a plurality of times to spread the distribution of resistance values from the initial distribution.

In the second step S12, a pulse is applied to each of the plurality of domain wall motion elements 100 a plurality of times. The pulse is applied by the pulse application device 3. The pulse applied in the second step S12 is a first pulse. The first pulse is one of the initialization pulses. The first pulse is applied, for example, in the third condition C3. The first pulse is applied a plurality of times. The voltage of each of the first pulses applied a plurality of times is smaller than, for example, the voltage of the operation pulse to be described later. Further, the pulse length of each of the first pulses applied a plurality of times is shorter than, for example, the pulse length of the operation pulse to be described later.

Figure 17:
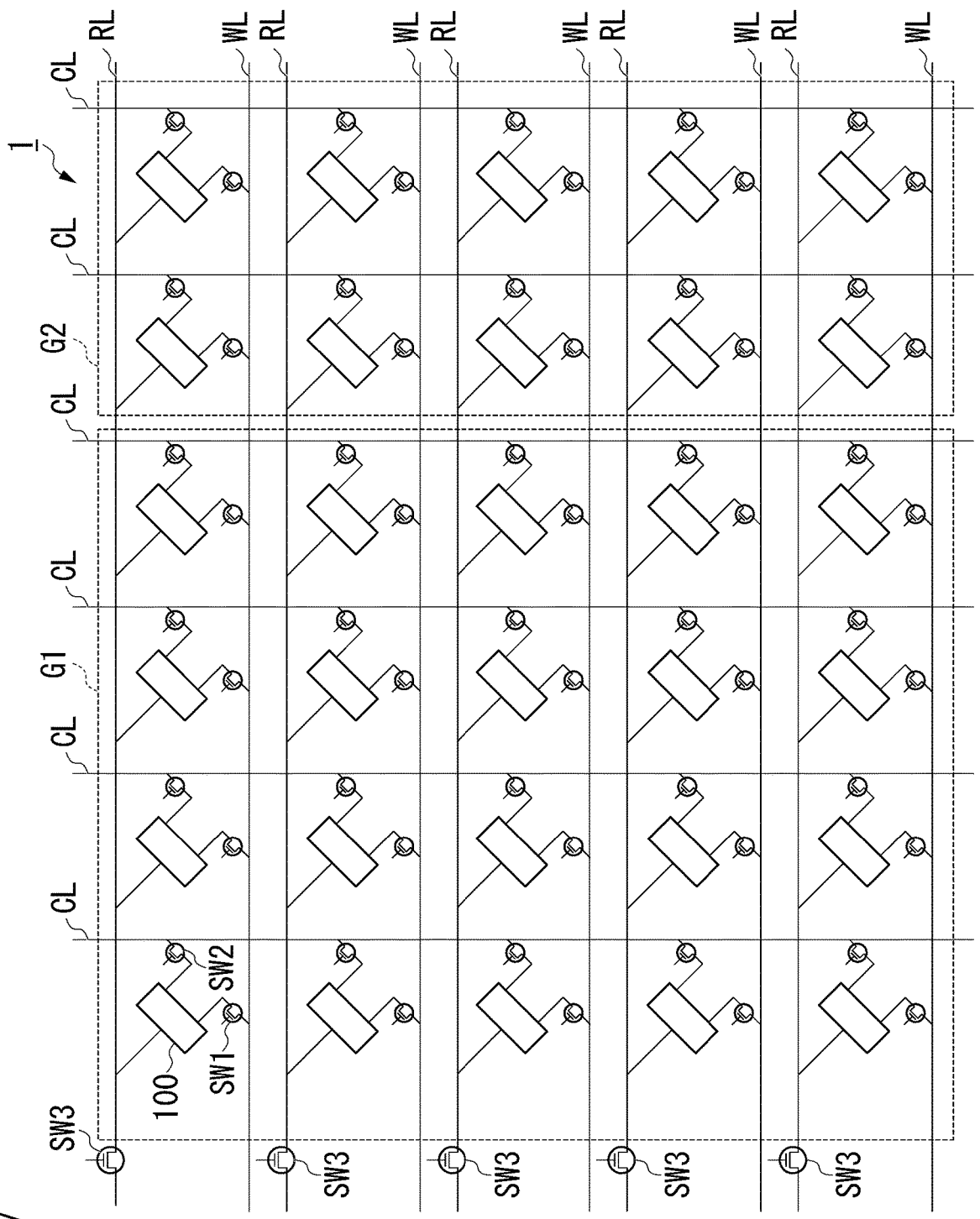
FIG. 17 is a circuit diagram of an integrated area of the magnetic array according to the first embodiment and is a circuit diagram when the magnetic array includes a plurality of element groups.

In the second step S12, for example, the first pulse is applied to each of the plurality of domain wall motion elements 100 under the same condition. In the second step S12, the plurality of domain wall motion elements 100 may be divided into a plurality of element groups, the first pulse under a different condition may be applied to each element group, or the first pulse under a condition different from those of other element groups may be applied to at least one element group among the plurality of element groups. For example, the magnetic array MA shown in FIG. 17 is divided into a first element group G1 and a second element group G2. For example, the first pulses under different conditions are applied to the first element group G1 and the second element group G2.

When the first pulse of the third condition C3 is applied to each of the plurality of domain wall motion elements 100, the domain wall DW moves in some domain wall motion elements 100 among the plurality of domain wall motion elements 100. On the other hand, the domain wall DW does not move even when the first pulse is applied in some domain wall motion elements 100. Since the position of the domain wall DW is different between the element in which the domain wall DW has moved and the element in which the domain wall DW has not moved, the resistance value of the domain wall motion element 100 is different. As a result, the resistance value distribution of the plurality of domain wall motion elements 100 spreads from the initial distribution whenever the first pulse is applied.

Figure 18:
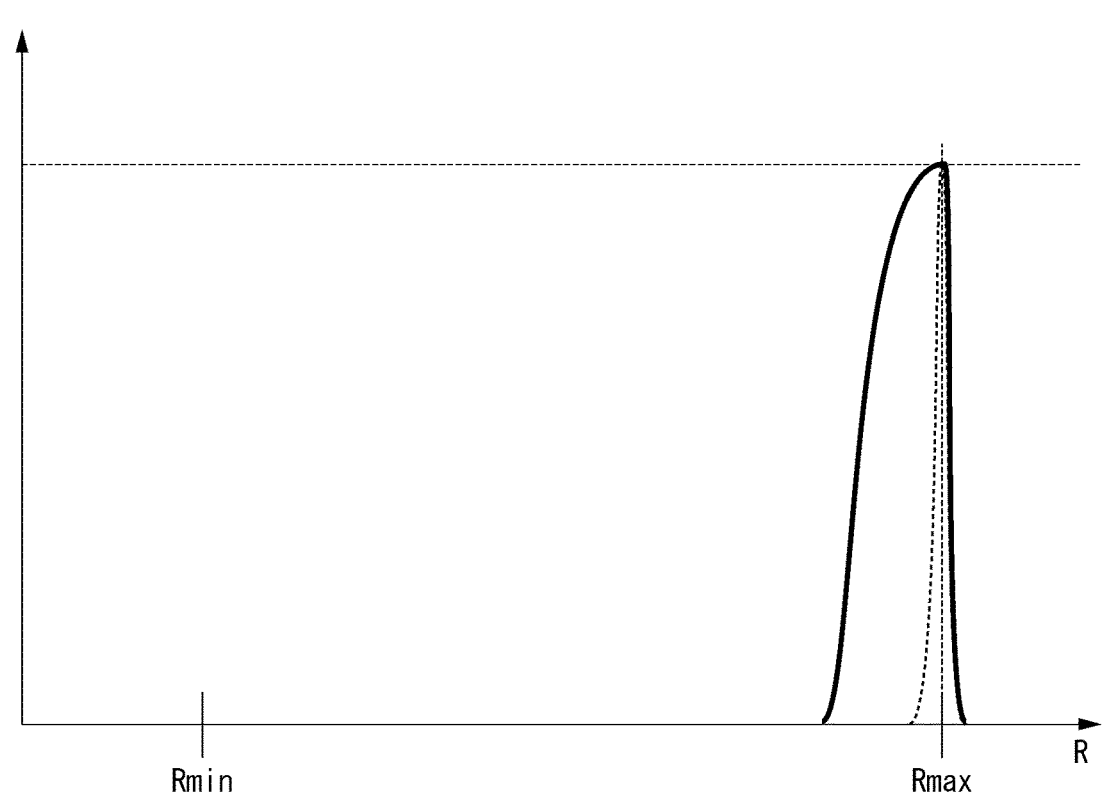
FIG. 18 is an example of a distribution of a resistance value after performing a second step in the magnetic array according to the first embodiment.
Figure 19:
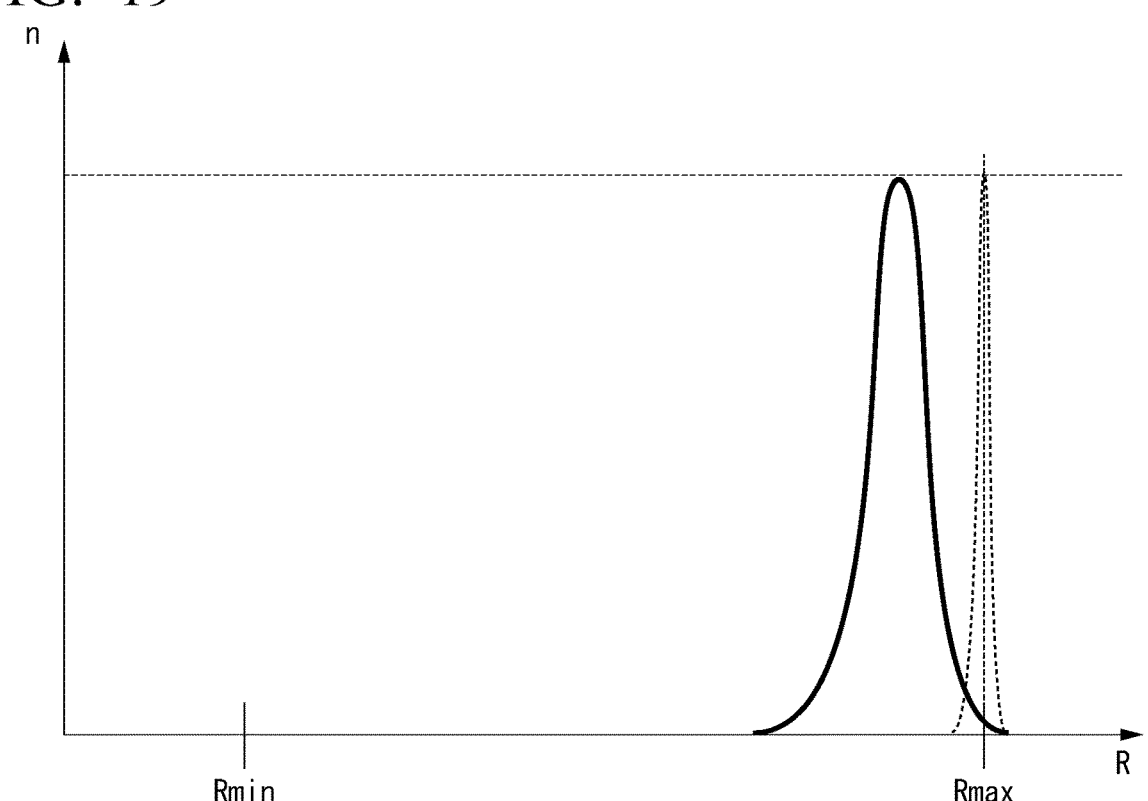
FIG. 19 is another example of a distribution of a resistance value after performing the second step in the magnetic array according to the first embodiment.
Figure 20:
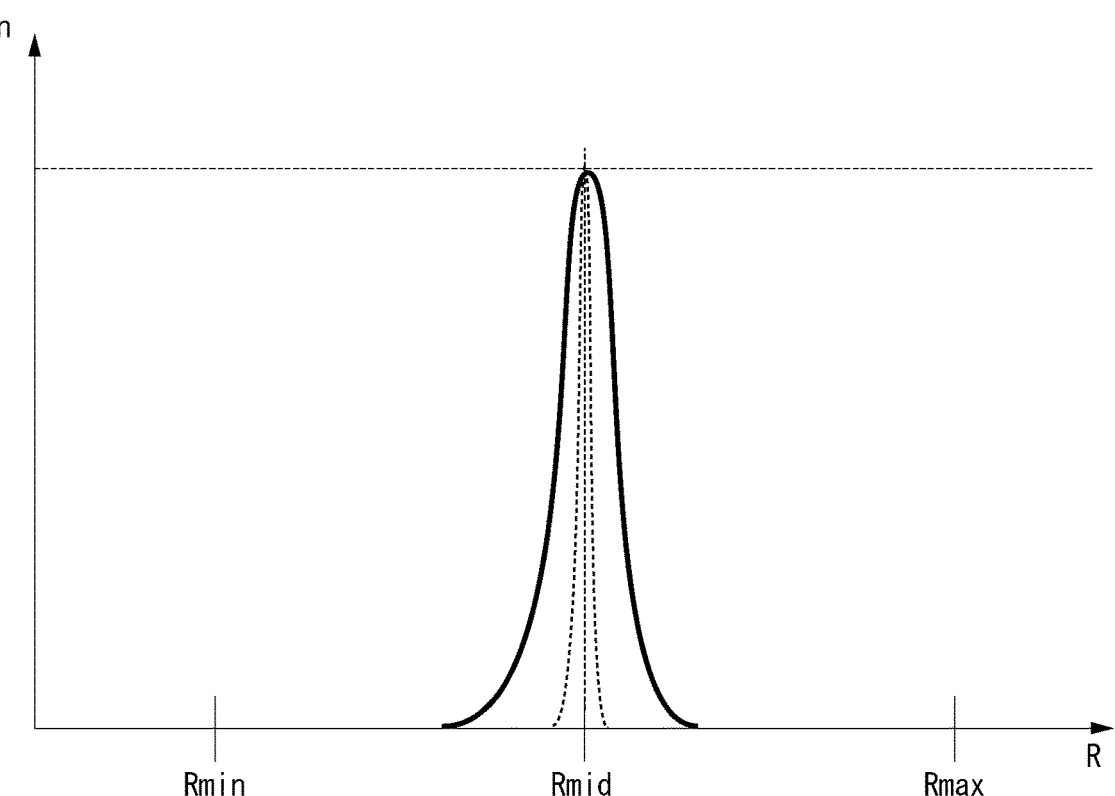
FIG. 20 is another example of a distribution of a resistance value after performing the second step in the magnetic array according to the first embodiment.

FIG. 18 shows a case in which the distribution spreads from the initial distribution of the first example. In the case of the first example, since the domain wall DW cannot move in a direction in which the resistance value of the domain wall motion element 100 increases, the distribution spreads to the low resistance side from the mode value of the initial distribution. Further, as shown in FIG. 19, the distribution may spread and the mode value may move toward the low resistance depending on the application conditions of the first pulse. FIG. 20 shows a case in which the distribution spreads from the initial distribution of the fourth example. In the case of the fourth example, since the domain wall DW can move in both directions in which the resistance value of the domain wall motion element 100 increases and decreases, the distribution can spread from the mode value of the initial distribution toward both the low resistance and the high resistance depending on the polarity of the first pulse.

The first pulse may be applied under the same conditions or the conditions may be changed whenever the first pulse is applied. When the application condition of the first pulse is changed, the probability of movement of the domain wall DW changes whenever the first pulse is applied. Therefore, the resistance value distribution can be set to a desired distribution in detail after the second step S12. Further, the temperature of the domain wall motion layer 10 when applying the first pulse may be changed. When the temperature of the domain wall motion layer 10 changes, the movement probability that the domain wall DW moves changes. By setting the temperature condition of the domain wall motion layer 10, the resistance value distribution can be designed to a desired distribution in detail.

Further, the polarity of the first pulse may be changed whenever the first pulse is applied a predetermined number of times. The polarity of the first pulse is the application direction of the first pulse. The polarity of the first pulse is controlled by the pulse application device 3. The pulse application device 3 is configured to change the polarity of the first pulse. For example, the polarity of the pulse from the first magnetization fixed layer 40 toward the second magnetization fixed layer 50 is "+" and the polarity of the pulse from the second magnetization fixed layer 50 toward the first magnetization fixed layer 40 is "−".

The number of times of applying the first pulse of the same polarity is, for example, two or more times. Further, the number of times of continuously applying the first pulse of the same polarity is preferably equal to or smaller than the number of times of applying the pulse required to move the domain wall DW from the first end A3*a* to the second end A3*b* using the pulse of the second condition C2. This is to avoid the domain wall DW from reaching the first end A3*a* or the second end A3*b* of the third area A3 due to the first pulse. An example of the pulse of the second condition C2 is an operation pulse applied in the operation step.

For example, when the first pulse with the polarity of "+" is applied, two patterns in which the domain wall DW moves and does not move in the −x direction occur stochastically. On the other hand, when the first pulse with the polarity of "−" is applied, two patterns in which the domain wall DW moves and does not move in the +x direction occur stochastically. When the polarity of the first pulse applied to each domain wall motion element 100 is changed, there is a possibility that the application of the pulse causes three states in which the domain wall DW moves in the +x direction, the domain wall DW moves in the −x direction, and the domain wall DW does not move. As a result, the resistance value of each domain wall motion element 100 varies, and the resistance value distribution after the second step S12 spreads further.

Next, the third step S13 is performed if necessary. The third step S13 is performed, for example, based on the third program stored in the control unit 4 of the pulse application device 3. The third program instructs the control unit 4 to apply a pulse to each of the plurality of domain wall motion elements 100 a plurality of times.

In the third step S13, the second pulse is applied to each domain wall motion element 100. The second pulse may be applied to each of the element groups (for example, the first element group G1 and the second element group G2) under different conditions. The second pulse may be applied only to some of the plurality of domain wall motion elements 100. The second pulse is one of the initialization pulses. The second pulse is applied under a condition that the resistance value of each of the plurality of domain wall motion elements 100 is changeable. The second pulse is applied, for example, under the second condition C2.

Figure 21:
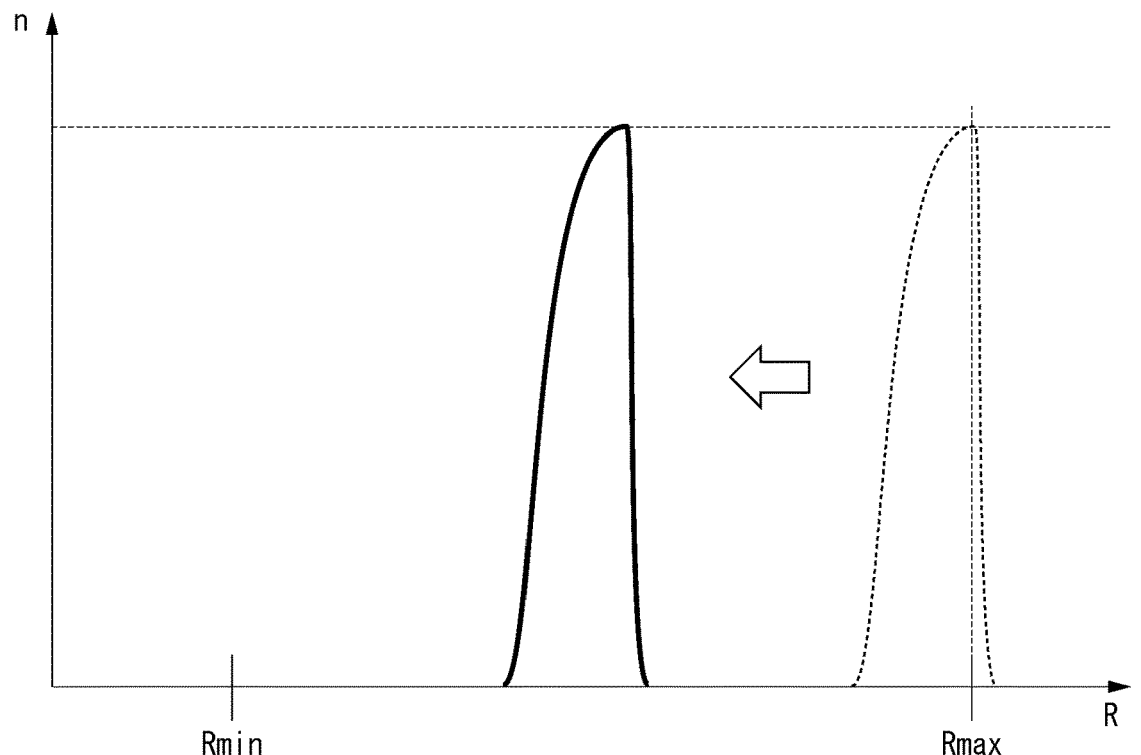
FIG. 21 is an example of a distribution of a resistance value after performing a third step in the magnetic array according to the first embodiment.

FIG. 21 is an example of the distribution of the resistance value after performing the third step S13 in the magnetic array MA according to the first embodiment. When the second pulse is applied, the domain wall DW of each domain wall motion element 100 moves. As a result, the distribution of the resistance value is shifted (as indicated by the solid line of FIG. 21) from the previous state (as indicated by the dotted line of FIG. 21) before performing the third step S13. When the third step S13 is performed, the resistance value distribution of the domain wall motion element 100 can be finely adjusted.

Next, the resistance detection step S2 is performed if necessary. In the resistance detection step S2, the resistance value of each domain wall motion element 100 is detected. For the resistance value of the magnetoresistance effect element 100, the resistance values of all magnetoresistance effect elements 100 may be measured or the resistance values of some magnetoresistance effect elements 100 may be measured. The resistance value is detected by the resistance detection device 6. The resistance detection step S2 is performed based on the detection program stored in the control unit 4 or the resistance detection device 6.

By detecting the resistance value of the domain wall motion element 100 in the resistance detection step S2, it can be confirmed whether the resistance value is within a predetermined range and whether the distribution of the resistance value is sufficiently dispersed. Depending on the resistance value detected in the resistance detection step S2, the initialization step S1 may be returned after the resistance detection step S2.

Next, the operation step S3 is performed. In the operation step S3, an operation pulse is applied to a predetermined domain wall motion element 100. The operation pulse is applied by the pulse application device 3. The pulse application device 3 is configured to apply the operation pulse to each domain wall motion element 100. The address of the predetermined domain wall motion element 100 is designated by the control unit 4. The operation step S3 is performed based on the operating program instructed from the control unit 4.

The operation step S3 includes, for example, a writing step S31 and a reading step S32. In the writing step S31, the operation pulse is applied to a predetermined domain wall motion element 100 and the resistance value of the predetermined domain wall motion element 100 is changed. The resistance value of the predetermined domain wall motion element 100 corresponds to the data of the magnetic memory. Further, the resistance value of the predetermined domain wall motion element 100 corresponds to the weight of the neuromorphic device. In the writing step S31, an operation pulse is applied along the domain wall motion layer 10. The operation pulse in the writing step S31 is the pulse of the second condition C2.

In the reading step S32, a detection pulse is applied to the predetermined domain wall motion element 100 and the resistance value of the predetermined domain wall motion element 100 is read. In the reading step S32, the detection pulse is applied from, for example, the ferromagnetic layer 30 toward the first magnetization fixed layer 40 or the second magnetization fixed layer 50. The detection pulse of the reading step S32 is the pulse of the first condition C1. By the detection pulse, the resistance value of the predetermined domain wall motion element 100 is read.

After performing the operation step S3, the initialization step S1 may be returned if necessary.

Next, a case in which the magnetic array MA is applied to a neuromorphic device will be specifically described as an example. The magnetic array MA can be applied to the neuromorphic device.

The neuromorphic device includes, for example, the magnetic array MA and an output conversion unit. The output conversion unit has an activation function. The output conversion unit is provided at each end portion of the second wiring CL. The output conversion unit converts the sum-of-products calculation result output from the second wiring CL according to the activation function.

The neuromorphic device is a device that performs neural network operations. The neuromorphic device artificially imitates the relationship between neurons and synapses in the human brain.

Figure 22:
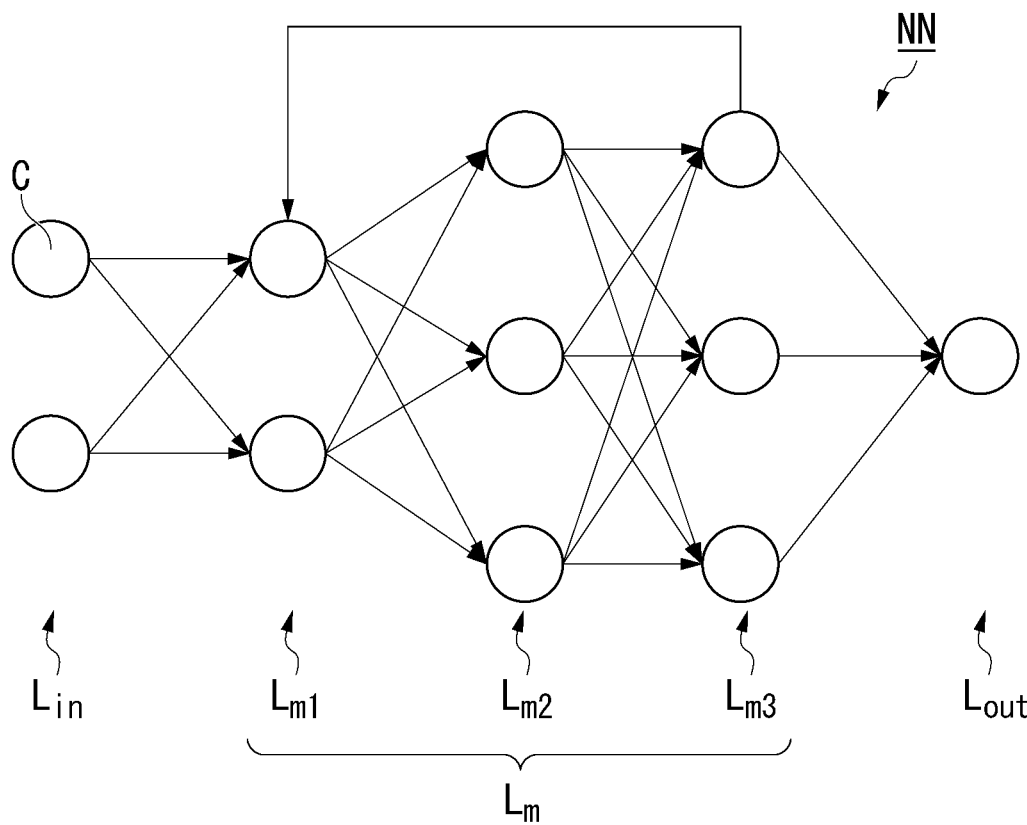
FIG. 22 is a schematic diagram of a neural network.

FIG. 22 is a schematic diagram of a neural network NN. The neural network NN includes an input layer $L_{in}$, an intermediate layer $L_m$, and an output layer $L_{out}$. FIG. 22 shows an example in which there are three intermediate layers $L_m$, but the number of the intermediate layers $L_m$ does not matter. Each of the input layer $L_{in}$, the intermediate layer $L_m$, and the output layer $L_{out}$ includes a plurality of chips C, and each chip C corresponds to a neuron in the brain. Each of the input layer $L_{in}$, the intermediate layer $L_m$, and the output layer $L_{out}$ is connected by a transmission means. The transmission means corresponds to synapses in the brain. The neural network NN increases the correct answer rate of the problem by learning the transmission means (synapse). Learning is finding knowledge that can be used in the future from information. The neural network NN learns by operating while changing the weight applied to the transmission means. The transmission means performs a product calculation for weighting the input signals and a sum calculation for adding the product calculation results. That is, the transmission means performs a sum-of-products calculation.

The magnetic array MA can perform a sum-of-products calculation. In the domain wall motion element 100, the resistance value changes analogously as the position of the domain wall DW changes. The Designing the resistance value of the domain wall motion element 100 corresponds to giving weight to the transmission means.

For example, in FIG. 3, a current flows from the third wiring RL toward the second wiring CL. The current (output value) output from the second wiring CL differs depending on the resistance value (weight) of the domain wall motion element 100. That is, the application of the current from the third wiring RL toward the second wiring CL corresponds to the product calculation in the neural network NN. Further, the second wiring CL is connected to the plurality of domain wall motion elements 100 belonging to the same column and the current detected at the end portion of the second wiring CL is a value obtained by summing the results of the product calculations performed by the respective domain wall motion elements 100. Therefore, the magnetic array MA functions as a sum-of-products calculator of the neuromorphic device.

For example, as shown in FIG. 17, when the magnetic array MA includes a plurality of element group (for example, a first element group G1 and a second element group G2), each element group can perform different sum-of-products calculations. When the magnetic array MA performs a plurality of sum-of-products calculations, for example, the first element group G1 may perform one sum-of-products calculation and the second element group G2 may perform the other sum-of-products calculation. In this case, the sum-of-products calculation performed by the first element group G1 and the sum-of-products calculation performed by the second element group G2 may be responsible for processing between different layers in the neural network NN (transmission by synapses).

The above-described initialization step S1 corresponds to a step of initializing the neuromorphic device. In the case of the neuromorphic device, learning accuracy and learning efficiency are improved if the initial state before learning is not constant. In the initialization step S1 according to this embodiment, a variation is given to the distribution of the resistance value of the domain wall motion element 100. Further, in the initialization step S1 according to this embodiment, the initial value of each domain wall motion element 100 can be changed whenever the initialization step S1 is performed instead of setting the same initial value each time. Therefore, the magnetic array MA after the initialization step S1 according to this embodiment is suitable as the initial state of the neuromorphic device.

In the case of the neuromorphic device, the above-described operation step S3 corresponds to the weight setting processing and the calculation processing after setting the weight. The weight setting processing corresponds to the writing step S31 of the operation step S3. The calculation processing corresponds to the reading step S32 of the operation step S3.

The weight setting processing is a processing for setting the resistance value of each domain wall motion element 100. The weight corresponds to the resistance value of each domain wall motion element 100. The weight changes according to the position of the domain wall DW in the domain wall motion layer 10. It is easier to optimize the weight from a state in which the distribution of the resistance values of the domain wall motion element 100 varies than to optimize from a state in which the distribution is constant.

The calculation processing performs a sum-of-products calculation after optimizing weights. The current applied from each of the third wirings RL of the magnetic array MA is the input to the sum-of-products calculator and the current output from each of the second wirings CL of the magnetic array MA is the output from the sum-of-products calculator. The input signal to the sum-of-products calculator may be controlled by the pulse length, the pulse height, or the pulse frequency. The result of the calculation processing (reading step S32) may be fed back to the control unit 4 that performs weight setting processing (writing step S31).

As described above, the magnetic array MA according to this embodiment can give variation to the distribution of the resistance values of the plurality of domain wall motion elements 100 when the plurality of domain wall motion elements 100 are initialized. Further, when the distribution of the resistance values of the plurality of domain wall motion elements 100 is varied, there is no need to perform write processing under individual conditions for each individual domain wall motion element 100. Therefore, according to the magnetic array MA of this embodiment, the distribution of the resistance values of the plurality of domain wall motion elements 100 can be easily varied.

Although the preferred embodiments of the present disclosure have been described in detail above, the present disclosure is not limited to these embodiments. For example, the featured configurations of the respective embodiments may be combined or a part of them may be changed without changing the gist of the disclosure.

For example, the control unit 4 may incorporate a random number generator. The random number generator may randomly determine the magnitude, length, polarity, and the like of the first pulse. By using the random number generator, the distribution spread degree by the first pulse varies whenever performing the initialization step S1.

Further, for example, the domain wall motion element 100 may be replaced with a variable resistance element. The variable resistance element is, for example, a phase change memory (PCM), a resistance change memory, or the like. In this case, the resistance value distribution of the plurality of variable resistance elements varies in the initial distribution.

REFERENCE SIGNS LIST

1 Integrated area
2 Peripheral area
3 Pulse application device
4 Control unit
5 Output unit
6 Resistance detection device
7 Control device
8 Magnetic field application device
10 Domain wall motion layer
20 Non-magnetic layer
30 Ferromagnetic layer
40 First magnetization fixed layer
50 Second magnetization fixed layer
90 Insulating layer
100, 101 Domain wall motion element
A1 First area
A2 Second area
A3 Third area
A3a First end
A3b Second end
A31 First magnetic domain
A32 Second magnetic domain
C Chip
C1 First condition
C2 Second condition
C3 Third condition
CL Second wiring
D Drain
DW Domain wall
G Gate electrode
G1 First element group
G2 Second element group
GI Gate insulating film
$L_{in}$ Input layer
$L_m$ Intermediate layer
$L_{out}$ Output layer
MA magnetic array
$M_{30}$, $M_{31}$, $M_{32}$, $M_{50}$, $M_{60}$, $M_{A1}$, $M_{A2}$, $M_{A31}$, $M_{A32}$ Magnetization
NN Neural network
RL Third wiring
S Source
S1 Initialization step
S2 Resistance detection step
S3 Operating step
S11 First step
S12 Second step
S13 Third step
S31 Writing step
S32 Reading step
Sub Substrate
SW1 First switching element
SW2 Second switching element
SW3 Third switching element
Tr Transistor
V Via wiring
WL First wiring

The invention claimed is:

1. A magnetic array comprising:
a plurality of magnetoresistance effect elements; and
a pulse application device which applies a pulse to each of the plurality of magnetoresistance effect elements, wherein each of the plurality of magnetoresistance effect elements includes a domain wall motion layer, a ferromagnetic layer, and a non-magnetic layer sandwiched between the domain wall motion layer and the ferromagnetic layer,
wherein the pulse application device is configured to apply an initialization pulse and an operation pulse to each of the plurality of magnetoresistance effect elements,
wherein the initialization pulse has a first pulse that is applied a plurality of times to widen a distribution of resistance values of the plurality of magnetoresistance effect elements from an initial distribution, and
wherein a voltage of each first pulse is smaller than a voltage of the operation pulse or each pulse length of the first pulse is shorter than a pulse length of the operation pulse.

2. The magnetic array according to claim 1, wherein the pulse application device is configured to apply the first pulse to each of the plurality of magnetoresistance effect elements under a same condition.

3. The magnetic array according to claim 1, wherein the pulse application device is able to change the polarity of the first pulse whenever the first pulse is applied a predetermined number of times.

4. The magnetic array according to claim 3, wherein the predetermined number of times is two or more.

5. The magnetic array according to claim 1, wherein the pulse application device is able to change the polarity of the first pulse every predetermined number of times, and
wherein the predetermined number of times is equal to or smaller than the number of times of applying the operation pulse required to move a domain wall from a first end to a second end of a domain wall movable area in which the domain wall is movable in the domain wall motion layer.

6. The magnetic array according to claim 1, wherein the initialization pulse further includes a second pulse, and
wherein the second pulse is applied under a condition that the resistance value of each of the plurality of magnetoresistance effect elements is changeable.

7. The magnetic array according to claim 1, further comprising:
a magnetic field application device which applies a magnetic field to each of the plurality of magnetoresistance effect elements,
wherein the magnetic field application device is able to set the initial distribution by applying a magnetic field to each of the plurality of magnetoresistance effect elements.

8. The magnetic array according to claim 1, wherein the initialization pulse further includes a third pulse for setting the initial distribution, and
wherein the pulse application device is able to set the initial distribution by applying the third pulse to each of the plurality of magnetoresistance effect elements.

9. The magnetic array according to claim 8, wherein the third pulse has a longer pulse length or a higher voltage than the first pulse.

10. The magnetic array according to claim 1, wherein the initialization pulse further includes a third pulse for setting the initial distribution,
wherein the pulse application device is able to set the initial distribution by applying the third pulse to each of the plurality of magnetoresistance effect elements, and
wherein the number of times of applying the third pulse is equal to or larger than the number of times of applying the operation pulse required to move a domain wall from a first end to a second end of a domain wall movable area in which the domain wall is movable in the domain wall motion layer.

11. The magnetic array according to claim 1, wherein the pulse application device is able to set a mode value of the initial distribution, and
wherein the mode value is in a range of 30% of a difference between a mean value of a maximum resistance value and a mean value of a minimum resistance value centering on a median value between the mean value of the maximum resistance value of each magnetoresistance effect element and the mean value of the minimum resistance value of each magnetoresistance effect element.

12. The magnetic array according to claim 1, wherein the pulse application device is able to set the mode value of the initial distribution, and
wherein the mode value is a mean value of a maximum resistance value of each magnetoresistance effect element or a mean value of a minimum resistance value of each magnetoresistance effect element.

13. The magnetic array according to claim 1, wherein the pulse application device sets a position of a domain wall of each domain wall motion layer to the first end or the second end of the domain wall movable area in which the domain wall is movable in the domain wall motion layer in the initial distribution.

14. The magnetic array according to claim 1, further comprising:
a resistance detection device which detects a resistance of each of the plurality of magnetoresistance effect elements.

15. The magnetic array according to claim 1, wherein the plurality of magnetoresistance effect elements are divided into a plurality of element groups, and
wherein the pulse application device is configured to apply the first pulse under a condition different from those of other element groups to at least one element group among the plurality of element groups.

16. The magnetic array according to claim 15, wherein the magnetic array is used in a neural network, and
wherein each of the plurality of element groups is responsible for operations between different layers in the neural network.

17. A magnetic array comprising:
a plurality of magnetoresistance effect elements; and
a pulse application device which applies a pulse to each of the plurality of magnetoresistance effect elements, wherein each of the plurality of magnetoresistance effect elements includes a domain wall motion layer, a ferromagnetic layer, and a non-magnetic layer sandwiched between the domain wall motion layer and the ferromagnetic layer, wherein the pulse application device is configured to apply an initialization pulse and an operation pulse to each of the plurality of magnetoresistance effect elements, wherein the initialization pulse has a first pulse that is applied a plurality of times to widen a distribution of resistance values of the plurality of magnetoresistance effect elements from an initial distribution, and wherein the first pulse is applied to each of the plurality of magnetoresistance effect elements under a condition that a probability that a resistance value of each magnetoresistance effect element changes when the first pulse is applied to each magnetoresistance effect element is larger than 0% and smaller than 100%, wherein the operation pulse is applied to a predetermined magnetoresistance effect element after the initialization pulse under a condition that a probability that a resistance value of the predetermined magnetoresistance effect element changes is 100%.

18. A magnetic array control method comprising:

an initialization step of initializing a plurality of magnetoresistance effect elements each including a domain wall motion layer, a ferromagnetic layer, and a non-magnetic layer sandwiched between the domain wall motion layer and the ferromagnetic layer, wherein the initialization step includes a first step of setting an initial distribution of resistance values of the plurality of magnetoresistance effect elements and a second step of applying a first pulse to each of the plurality of magnetoresistance effect elements a plurality of times to widen the initial distribution.

19. The magnetic array control method according to claim 18, wherein, in the second step, the first pulse is applied to each of the plurality of magnetoresistance effect elements under a condition that the probability that a resistance value of each magnetoresistance effect element changes when the first pulse is applied to each magnetoresistance effect element is larger than 0% and smaller than 100%.

20. The magnetic array control method according to claim 18, further comprising:

an operation step of operating the plurality of magnetoresistance effect elements after the initialization step, wherein the operation step applies an operation pulse to a predetermined magnetoresistance effect element, and wherein the first pulse has a voltage smaller than that of the operation pulse or a pulse length of each first pulse is shorter than a pulse length of the operation pulse.

21. The magnetic array control method according to claim 18, wherein the second step applies the first pulse to each of the plurality of magnetoresistance effect elements under a same condition.

22. The magnetic array control method according to claim 18, wherein, in the second step, the polarity of the first pulse is changed every predetermined number of times.

23. The magnetic array control method according to claim 18, wherein the initialization step includes a third step of applying a second pulse after the second step, and wherein the second pulse is applied under a condition that a resistance value of each of the plurality of magnetoresistance effect elements is changeable.

24. The magnetic array control method according to claim 18, wherein, in the first step, a third pulse is applied to each of the plurality of magnetoresistance effect elements to set the initial distribution.

25. The magnetic array control method according to claim 18, further comprising:

a detection step of measuring a resistance value of each of the plurality of magnetoresistance effect elements after the initialization step.

26. The magnetic array control method according to claim 18, wherein, in the second step, the plurality of magnetoresistance effect elements are divided into a plurality of element groups and the first pulse under a condition different from those of other element groups is applied to at least one element group of the plurality of element groups.

27. The magnetic array control method according to claim 26, wherein the magnetic array control method is used in a neural network, and wherein each of the plurality of element groups is responsible for operations between different layers in the neural network.

28. A non-transitory computer readable media comprising:

an initialization program for instructing initialization of a plurality of magnetoresistance effect elements each including a domain wall motion layer, a ferromagnetic layer, and a non-magnetic layer sandwiched between the domain wall motion layer and the ferromagnetic layer, wherein the initialization program includes a first program for setting an initial distribution of resistance values of the plurality of magnetoresistance effect elements and a second program for applying a first pulse to each of the plurality of magnetoresistance effect elements a plurality of times to widen the initial distribution.

29. The non-transitory computer readable media according to claim 28, wherein the second program is instructed to apply the first pulse to each of the plurality of magnetoresistance effect elements under a condition that the probability that a resistance value of each magnetoresistance effect element changes when the first pulse is applied to each magnetoresistance effect element is larger than 0% and smaller than 100%.

30. The non-transitory computer readable media according to claim 28, further comprising:

an operating program for operating the plurality of magnetoresistance effect elements, wherein the operating program applies an operation pulse to a predetermined magnetoresistance effect element, and wherein the first pulse has a voltage smaller than that of the operation pulse or a pulse length of each first pulse is shorter than a pulse length of the operation pulse.

31. The non-transitory computer readable media according to claim 28, wherein the second program is instructed to apply the first pulse to each of the plurality of magnetoresistance effect elements under a same condition.

32. The non-transitory computer readable media according to claim 28, wherein the second program changes the polarity of the first pulse every predetermined number of times.

33. The non-transitory computer readable media according to claim 28, wherein the initialization program further includes a third program of instructing to apply a second pulse to each of the plurality of magnetoresistance effect elements after the second program, and wherein the second pulse is able to change a resistance value of each of the plurality of magnetoresistance effect elements.

34. The non-transitory computer readable media according to claim 28, wherein the first program applies a third pulse to each of the plurality of magnetoresistance effect elements to set the initial distribution.

35. The non-transitory computer readable media according to claim 28, further comprising:

a detection program for measuring a resistance value of each of the plurality of magnetoresistance effect elements after the initialization program.

36. The non-transitory computer readable media according to claim 28, wherein the second program divides the plurality of magnetoresistance effect elements into a plurality of element groups and applies the first pulse under a condition different from those of other element groups to at least one element group among the plurality of element groups.

37. The non-transitory computer readable media according to claim 36, wherein a magnetic array control program is used to control a neural network, and wherein each of the plurality of element groups is responsible for operations between different layers in the neural network.

*    *    *    *    *